(12) United States Patent
Price

(10) Patent No.: US 12,378,663 B2
(45) Date of Patent: Aug. 5, 2025

(54) DEPOSITING COATINGS ON AND WITHIN A HOUSING, APPARATUS, OR TOOL USING A COATING SYSTEM POSITIONED THEREIN

(71) Applicant: Halliburton Energy Services, Inc., Houston, TX (US)

(72) Inventor: James M. Price, Houston, TX (US)

(73) Assignee: Halliburton Energy Services, Inc., Houston, TX (US)

(*) Notice: Subject to any disclaimer, the term of this patent is extended or adjusted under 35 U.S.C. 154(b) by 246 days.

(21) Appl. No.: 17/751,085

(22) Filed: May 23, 2022

(65) Prior Publication Data
US 2022/0282375 A1 Sep. 8, 2022

Related U.S. Application Data

(62) Division of application No. 16/717,939, filed on Dec. 17, 2019, now Pat. No. 11,371,145.
(Continued)

(51) Int. Cl.
*C23C 16/04* (2006.01)
*C23C 16/02* (2006.01)
(Continued)

(52) U.S. Cl.
CPC ........ *C23C 16/045* (2013.01); *C23C 16/0236* (2013.01); *C23C 16/45536* (2013.01);
(Continued)

(58) Field of Classification Search
CPC ............ C23C 16/045; C23C 16/45536; C23C 16/45544; C23C 16/45555
See application file for complete search history.

(56) References Cited

U.S. PATENT DOCUMENTS

| 5,154,862 A | 10/1992 | Reagan et al. |
| 6,416,577 B1* | 7/2002 | Suntoloa ................. C23C 16/46 117/88 |

(Continued)

FOREIGN PATENT DOCUMENTS

| JP | 06279998 A | 10/1994 |
| JP | 2004337835 A | 12/2004 |

(Continued)

OTHER PUBLICATIONS

Filing receipt and specification for patent application entitled "Depositing Coatings on and Within Housings, Apparatus, or Tools Utilizing Pressurized Cells," Christopher Michael Jones et al., filed Aug. 6, 2023 as U.S. Appl. No. 18/242,798.

(Continued)

*Primary Examiner* — Kelly M Gambetta
(74) *Attorney, Agent, or Firm* — DeLizio, Peacock, Lewin & Guerra, LLP

(57) ABSTRACT

A method of coating an interior surface of a housing defining a volume includes partitioning the volume into a first zone and a second zone, the first zone isolated from fluid communication with the second zone; introducing one or more reactant gases, plasma, ions, or a combination thereof to the first zone and the second zone; and forming one or more coating layers on all or a portion of the interior surface within the first and second zones via reaction of the reactant gases, the plasma, or the combination thereof. A device for coating an interior surface of a housing is also provided.

23 Claims, 9 Drawing Sheets

Related U.S. Application Data

(60) Provisional application No. 62/819,244, filed on Mar. 15, 2019.

(51) Int. Cl.
   *C23C 16/455* (2006.01)
   *C23C 16/50* (2006.01)
   *C23C 16/54* (2006.01)
   *H01J 37/32* (2006.01)

(52) U.S. Cl.
   CPC .. *C23C 16/45544* (2013.01); *C23C 16/45555* (2013.01); *C23C 16/50* (2013.01); *C23C 16/545* (2013.01); *H01J 37/32394* (2013.01); *H01J 37/32357* (2013.01)

(56) References Cited

U.S. PATENT DOCUMENTS

| | | | |
|---|---|---|---|
| 6,508,453 | B2 | 1/2003 | Mamyo |
| 6,863,130 | B2 | 3/2005 | Steele et al. |
| 7,300,684 | B2 | 11/2007 | Boardman et al. |
| 7,608,151 | B2 | 10/2009 | Tudhope et al. |
| 8,029,875 | B2 | 10/2011 | Wei et al. |
| 8,505,480 | B2 | 8/2013 | Biana |
| 8,753,725 | B2 | 6/2014 | Wei et al. |
| 9,238,864 | B2 | 1/2016 | Pelletier |
| 11,125,083 | B2 | 9/2021 | Jones et al. |
| 2003/0196600 | A1 | 10/2003 | Eidelman |
| 2006/0198965 | A1* | 9/2006 | Tudhope ............ C23C 16/45578 427/248.1 |
| 2012/0298901 | A1 | 11/2012 | Ringgenberg |
| 2014/0154417 | A1 | 6/2014 | Choi et al. |
| 2014/0178637 | A1 | 6/2014 | Rajagopalan et al. |
| 2014/0260955 | A1 | 9/2014 | Aharonov |
| 2014/0287161 | A1 | 9/2014 | Ertas et al. |
| 2015/0059910 | A1 | 3/2015 | Honda et al. |
| 2015/0079309 | A1* | 3/2015 | Krueger ............ H01J 37/32394 118/723 R |
| 2016/0290103 | A1* | 10/2016 | Fontenelle ............... C23C 14/24 |
| 2018/0044800 | A1 | 2/2018 | Hendrix et al. |
| 2020/0017960 | A1 | 1/2020 | Tudhope et al. |
| 2020/0291519 | A1 | 9/2020 | Price |
| 2022/0062947 | A1 | 3/2022 | Jones et al. |
| 2022/0064793 | A1 | 3/2022 | Jones et al. |

FOREIGN PATENT DOCUMENTS

| | | | |
|---|---|---|---|
| JP | 4437647 | B2 | 3/2010 |
| KR | 100346019 | B1 | 8/2002 |
| KR | 1020090114997 | A | 11/2009 |
| KR | 1020140076251 | A | 6/2014 |
| KR | 101446197 | B1 | 10/2014 |
| KR | 20160001133 | U | 4/2016 |
| WO | 2014042622 | A1 | 3/2014 |
| WO | 2017095361 | A1 | 6/2017 |
| WO | 2019040843 | A1 | 2/2019 |
| WO | 2022046115 | A1 | 3/2022 |
| WO | 2022046116 | A1 | 3/2022 |

OTHER PUBLICATIONS

Filing receipt and specification for patent application entitled "Depositing Coatings on and Within Housings, Apparatus, or Tools Utilizing Counter Current Flow of Reactants," Christopher Michael Jones et al., filed Sep. 6, 2023 as U.S. Appl. No. 18/242,790.

Filing Receipt and Specification of Provisional Application entitled "Depositing Coatings on and Within a Well Tool Using a Well Tool Coating System Positioned Inside the Well Tool," by James M. Price, filed Mar. 15, 2019 as U.S. Appl. No. 62/819,244.

Foreign Communication from a related counterpart application—International Search Report and Written Opinion, PCT/US2015/062910, Aug. 29, 2016, 13 pages.

Foreign Communication from Related Application—International Search Report and Written Opinion of the International Searching Authority, International Application No. PCT/US2019/067203, dated Apr. 21, 2020, 14 pages.

Foreign Communication from Related Application—International Search Report and Written Opinion of the International Searching Authority, International Application No. PCT/US2019/067204, dated Apr. 21, 2020, 11 pages.

Foreign Communication from Related Application—International Search Report and Written Opinion of the International Searching Authority, International Application No. PCT/US2020/048791, dated May 21, 2021, 11 pages.

Foreign Communication from Related Application—International Search Report and Written Opinion of the International Searching Authority, International Application No. PCT/US2020/048794, dated May 27, 2021, 11 pages.

Filing Receipt, Specification and Drawings for U.S. Appl. No. 62/819,194, entitled "Depositing Coatings On and Within Tools," filed Mar. 15, 2019, 33 pages.

Office Action (30 Pages), Jan. 30, 2023, U.S. Appl. No. 17/004,707, filed Aug. 27, 2020.

Office Action (34 Pages), Jan. 30, 2023, U.S. Appl. No. 17/004,724, filed Aug. 27, 2020.

* cited by examiner

DEPOSITING COATINGS ON AND WITHIN A HOUSING, APPARATUS, OR TOOL USING A COATING SYSTEM POSITIONED THEREIN

REFERENCE TO RELATED APPLICATIONS

This application is a divisional of and claims priority to U.S. patent application Ser. No. 16/717,939, filed on Dec. 17, 2019 and published as U.S. Patent Application Publication No. 2020/0291519 A1, and entitled "Depositing Coatings On and Within A Housing, Apparatus, or Tool Using a Coating System Positioned Therein," which claims priority to U.S. Provisional Patent Application No. 62/819,244, filed on Mar. 15, 2019, and entitled "Depositing Coatings On and Within a Well Tool Using a Well Tool Coating System Positioned Inside The Well Tool," both of which are incorporated by reference herein in their entirety.

TECHNICAL FIELD

The present disclosure relates generally to depositing coatings within housings, apparatus, or tools, such as well tools for use in a wellbore. More specifically, but not by way of limitation, this disclosure relates to depositing coatings on and within such housings, apparatus, or tools, for example, a well tool, using a coating system positioned inside the housings, apparatus, or tools, for example, inside a well tool.

BACKGROUND

In applications, it can be desirable to deposit a coating on a surface (e.g., within a well tool) to withstand a particular environment to which the surface will be exposed during operation. For example, well tools for performing downhole operations are often subject to internal corrosion and abrasion as fluids flow through the well tools. Fluids such as hydrogen sulfide and mercury can also chemically react with (or be absorbed by) the interiors of the well tools. These destructive influences can reduce the lifespans of the well tools and cause a variety of other problems. A coating is sometimes deposited to withstand such environments and prolong tool life.

BRIEF SUMMARY OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
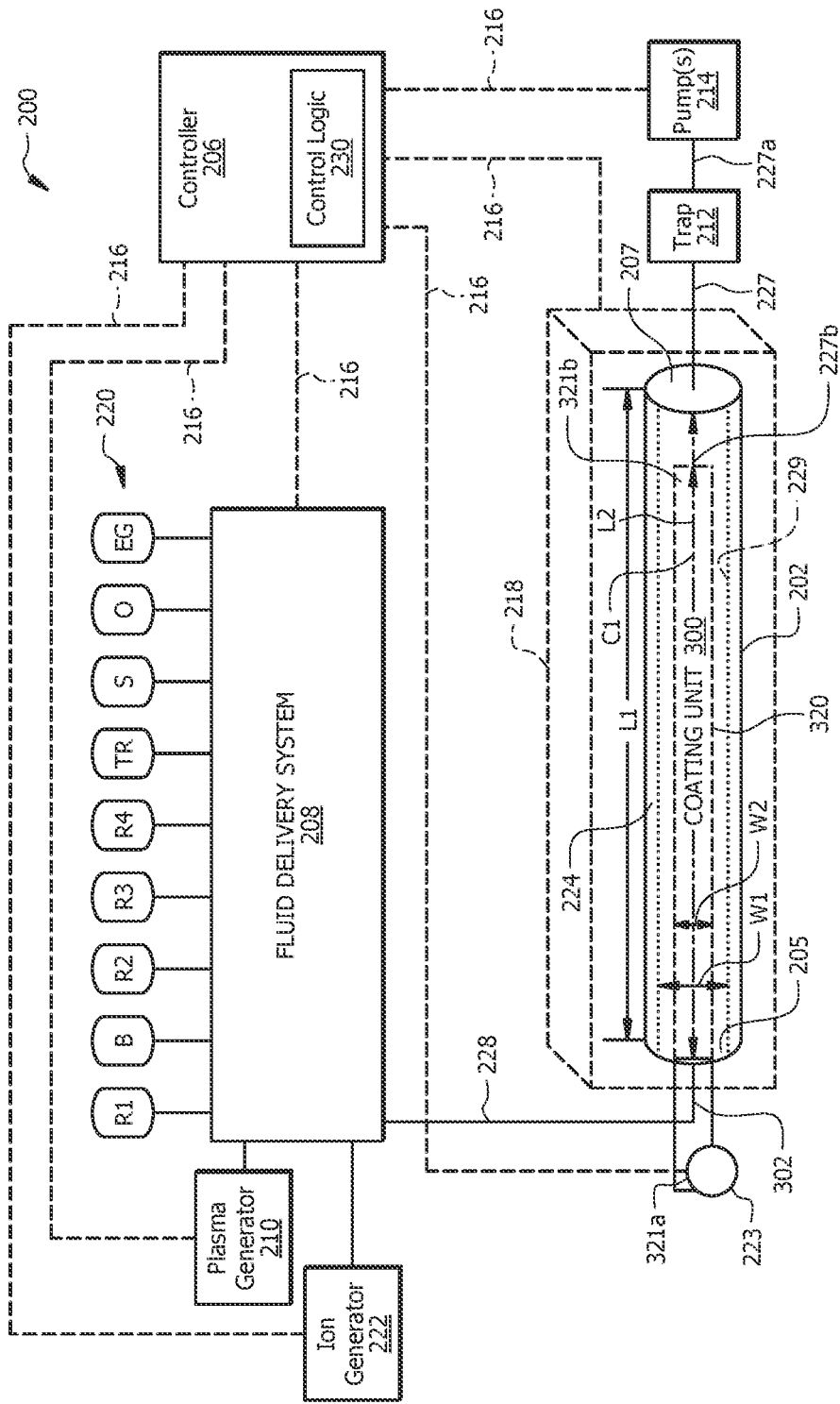
FIG. 1A is a block diagram of an example of a surface coating system according to some aspects.

It should be understood at the outset that although an illustrative implementation of one or more embodiments are provided below, the disclosed systems and/or methods may be implemented using any number of techniques, whether currently known or in existence. This disclosure, including the illustrative implementations, drawings, and techniques illustrated below, and the exemplary designs and implementations illustrated and described herein, may be modified within the scope of the appended claims along with their full scope of equivalents.

Certain aspects and features of the present disclosure relate to a housing, apparatus, or tool coating system (e.g., a well tool coating system), also referred to herein as a "coating system", "coating device" or simply "device", capable of translating and rotating within an interior region (also referred to herein as a "volume" or "interior volume") of a housing, apparatus, or tool (e.g., a well tool) to deposit coatings on (or more specifically inside of or on an interior surface of) the housing, apparatus, or tool (e.g., well tool). The coatings can resist physical wear on an interior surface of the housing, apparatus, or tool (e.g., well tool) due to abrasive or corrosive elements flowing there-through, resist the interior surface of the housing, apparatus, or tool (e.g., well tool) from chemically reacting with or absorbing fluids, and otherwise serve as a protective barrier to resist destruction of the housing, apparatus, or tool (e.g., well tool). The disclosed aspects of the tool coating system (e.g., well tool coating system), as further detailed below, allow it to be made compact and portable for enabling it to be used at any suitable location, such as at a jobsite, worksite, or wellsite, in a laboratory environment, or elsewhere.

In one particular example, the tool coating system (e.g., well tool coating system) includes a surface coating unit ("coating unit") having one or more components thereof (e.g., a fluid flow conduit) sized to fit within an inner volume of a housing, apparatus, or tool (e.g., well tool), so that the coating unit can translate through the interior volume of the housing, apparatus, or tool (e.g., well tool) and/or rotate within the interior volume of the housing, apparatus, or tool (e.g., well tool). The coating unit includes a fluid flow conduit (which may also be referred to as an elongated member, or which may further comprise an elongated member component or portion thereof) with barriers that define zones within the interior volume of the housing, apparatus, or tool (e.g., well tool) when the coating unit is positioned inside the housing, apparatus, or tool (e.g., well tool). Each zone is independent of the other zones and serves as a substantially enclosed volume (e.g., a deposition chamber) in which coatings of material can be deposited. The coating unit (e.g., the fluid flow component) includes at least one outlet (e.g., nozzle) within each zone for supplying one or more reactant gases into the zone. Reactant gases are gases that chemically react with a surface to produce a coating on the surface. Some examples of reactant gases include silane, methane, and carbon monoxide, and other examples are provided below. The coating unit (or component thereof such as the fluid flow conduit) can be translated back-and-forth through the well tool to alternatingly supply different reactant gases to each zone, thereby forming multiple coating layers inside each of the zones using one or more surface coating processes.

Creating the deposition chamber(s) inside the housing, apparatus, or tool (e.g., well tool) can enable the tool coating system (e.g., well tool coating system) to be used at any suitable location, without disassembling the housing, apparatus, or tool (e.g., well tool) into subcomponents and without the need for an expensive commercial vacuum-chamber as the deposition chamber. Rather, some examples of the present disclosure enable a surface coating process to be applied to a housing, apparatus, or tool (e.g., well tool) located at a worksite (e.g., wellsite), as many times as desired (e.g., after each job). The tool coating system (e.g., well tool coating system) can also cost less than traditional deposition systems, since forming a deposition chamber inside a housing, apparatus, or tool (e.g., well tool) is cheaper and faster than installing a commercial-grade vacuum chamber at a manufacturing or laboratory facility, which may be governed by tight regulations and cleanroom requirements.

Disclosed herein is a device for coating an interior surface of a housing defining a volume, the device comprising: a plurality of reactant gas sources including reactant gases for one or more surface coating processes; a fluid flow conduit fluidically coupled to the plurality of reactant gas sources and extending from the plurality of gas sources to the volume; a first barrier disposed about the fluid flow conduit and dividing the fluid flow conduit into a first portion and a second portion [within the volume]; and first and second fluid flow ports disposed within the first and second portions, respectively, of the fluid flow conduit, wherein the one or more of the reactant gases are flowable to the interior surface proximate the first and second fluid flow ports.

Likewise, disclosed herein is a method of coating an interior surface of a housing defining a volume, the method comprising: partitioning the volume into a first zone and a second zone, the first zone isolated from fluid communication with the second zone; introducing one or more reactant gases, plasma, ions, or a combination thereof to the first zone and the second zone; and forming one or more coating layers on all or a portion of the interior surface within the first and second zones via reaction of the reactant gases, the plasma, or the combination thereof.

The herein disclosed coating device or system can be utilized to deposit one or more coatings on an interior surface of a housing, apparatus, or tool (also referred to both individually and collectively herein by any individual term "tool", "housing", or "apparatus"), for example as will be described further herein with reference to FIG. 1A. Accordingly, the description herein is thus applicable to generic coating systems for coating generic apparatus, housings, or tools. By way of example, the term "housing" includes, but is not limited to, a structural component having an interior volume such as (without limitation) one or more components of an apparatus, device, or tool such as well tool.

Likewise, the description herein is applicable to, without limitation, specific uses such as, without limitation, "well tool coating systems" and "well tools", for example as will be described further herein with reference to FIG. 1B. Any of a variety of well tools (also referred to herein as wellbore tools or downhole tools) may have an interior surface on which to deposit a coating. Well tools come in different shapes and sizes and also typically have one or more passages connecting the interior region (also referred to herein as an "interior volume") to other regions inside the well tool and/or an external environment outside the well tool. While certain description herein is made with reference to well tools and well tool coating systems, in should be understood that the concepts disclosed herein are not limited to any specific embodiment such as well tools and well tool coating systems but rather may be applied generally to coating systems configured to effectively coat a surface adjacent an interior volume disposed within a housing, apparatus, or coating by any of the various surface coating techniques (e.g., ALD and/or CVD deposition techniques) disclosed herein.

A descriptor numeral can be utilized generically herein to refer to any embodiment of that component. For example, a barrier 316 can be utilized to generically refer to any number of barriers, such as a first barrier 316a, a second barrier 316b, a third barrier 316c, and/or a fourth barrier 316d, as depicted and described hereinbelow with reference to FIG. 3-FIG. 6B. By way of further example, a zone 312 can generically refer to any number of zones 312, for example a first zone 312a, a second zone 312b, a third zone 312c, and/or a fourth zone 312d, as depicted and described hereinbelow with reference to FIG. 3-FIG. 6B. An outlet or port 314 can generically refer to any number of outlets or ports, such as a first outlet or port 314a, a second outlet or port 314b, a third outlet or port 314c, and/or a fourth outlet or port 314d, as depicted and described hereinbelow with reference to FIG. 3-FIG. 6B. A set of flexible bristles 402 can generically refer to any sets of flexible bristles, such as a first set of flexible bristles 402a, and/or a second set of flexible bristles 402b, as depicted and described hereinbelow with reference to FIG. 4. Inlets 404 can generically refer to any number of inlets, such as first inlet 404a, second inlet 404b, and/or third inlet 404c, as depicted and described hereinbelow with reference to FIG. 4.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1A is a block diagram of an example of a surface coating system 200 that can apply one or more coatings on or inside (e.g., on an interior surface adjacent an interior volume of) a housing, apparatus or tool 202, also referred to herein as a housing 202, an apparatus 202, or a tool 202. As noted hereinabove, a surface coating system of this disclosure can be utilized to deposit one or more coatings on or within (e.g., on an interior surface adjacent an interior volume of) a variety of housings, apparatus, or tools 202. For example, housing, apparatus, or tool 202 can comprise a furnace tube, an aircraft component, a component of a water supply/treatment system; a component of a vehicle fuel system; a well tool 202A, a heat exchanger or component thereof such as a shell or plurality of tubes; a pump or component thereof such as a suction or discharge chamber; a reactor or component thereof such as a vessel, manifold, catalyst bed, injector, feed and/or discharge conduit; a distillation column or component thereof such as valves or trays; a condenser or component thereof such as a housing or condenser tubes; a reboiler or component thereof such as a housing or heating tubes; an interior volume of a storage vessel; an interior volume of a transportation vessel (e.g., a fluid transport trailer pulled by a semi truck); or another housing, apparatus, or tool 202. In embodiments, the housing, apparatus, or tool 202 comprises production tubing, a pipeline, or a well tool 202A. One such embodiment is depicted in FIG. 1B, which is a block diagram of an example of a coating system 200A (also referred to herein as a "well tool coating system 200A") being utilized to apply one or more coatings on or inside (e.g., on an interior surface adjacent an interior volume of) a well tool 202A. Well tool 202A is usable for performing one or more downhole operations, such as drilling, logging, fracturing, fishing, pulling, casing, cementing, or any combination of these, or other downhole operation.

Figure 2:
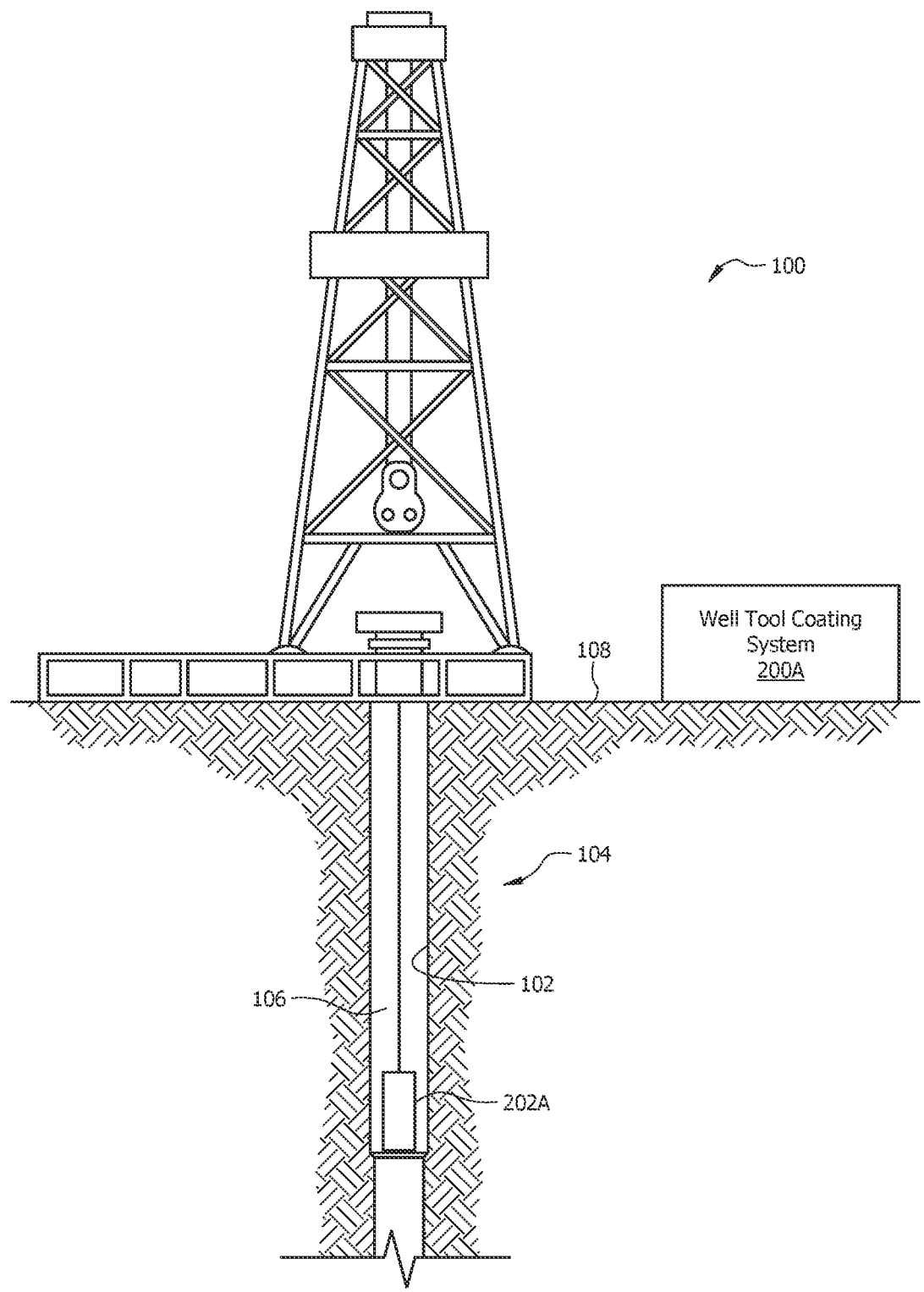
FIG. 2 is a generalized cross-sectional side view of an example of a well system with a well tool coating system according to some aspects.

FIG. 2 is a generalized cross-sectional side view of an example of a wellsite 100 at which a wellbore 102 is drilled through various earth strata of a subterranean formation 104 bearing hydrocarbons. The wellbore 102 is at least partially drilled and completed in this example, including a casing string 106 cemented within the wellbore 102 that extends from the well surface 108 through at least a portion of the drilled subterranean formation 104. The casing string 106 can provide a conduit through which produced formation fluids (e.g., production fluids) can travel from downhole to the well surface 108. Without being limited to the particular features of the illustrated well, it should be recognized that well tools suitable for coating according to this disclosure may be involved throughout the process of initially drilling, forming, and completing the wellbore 102, and throughout the service life of the wellbore 102 and beyond. The wellsite 100 of FIG. 2 is illustrated by way of example as an onshore well system, although the disclosure is equally applicable to wells formed offshore.

A surface coating system 200/well tool coating system 200A according to this disclosure can be positioned at a jobsite (also referred to herein as a worksite or wellsite) for applying coatings on interior surfaces 229 of a housing, apparatus, or tool 202/well tool 202A at the jobsite. The surface coating system 200/well tool coating system 200A can be portable, and further comprise a portable conveyance (e.g., trailer, skid, vehicle, etc.) configured to transport the surface coating system 200/well tool coating system 200A to the worksite (e.g., a wellsite). The surface coating system 200/well tool coating system 200A can apply the coating(s) to the tool 202/well tool 202A at any suitable time, such as before the tool performs an operation, after the tool performs an operation, or both. As will be described further hereinbelow, the coating system 200 can be capable of applying the coating(s) to the tool 202/well tool 202A using multiple types of surface coating processes, such as, without limitation, atomic layer deposition (ALD) and/or chemical vapor deposition (CVD).

Figure 1B:
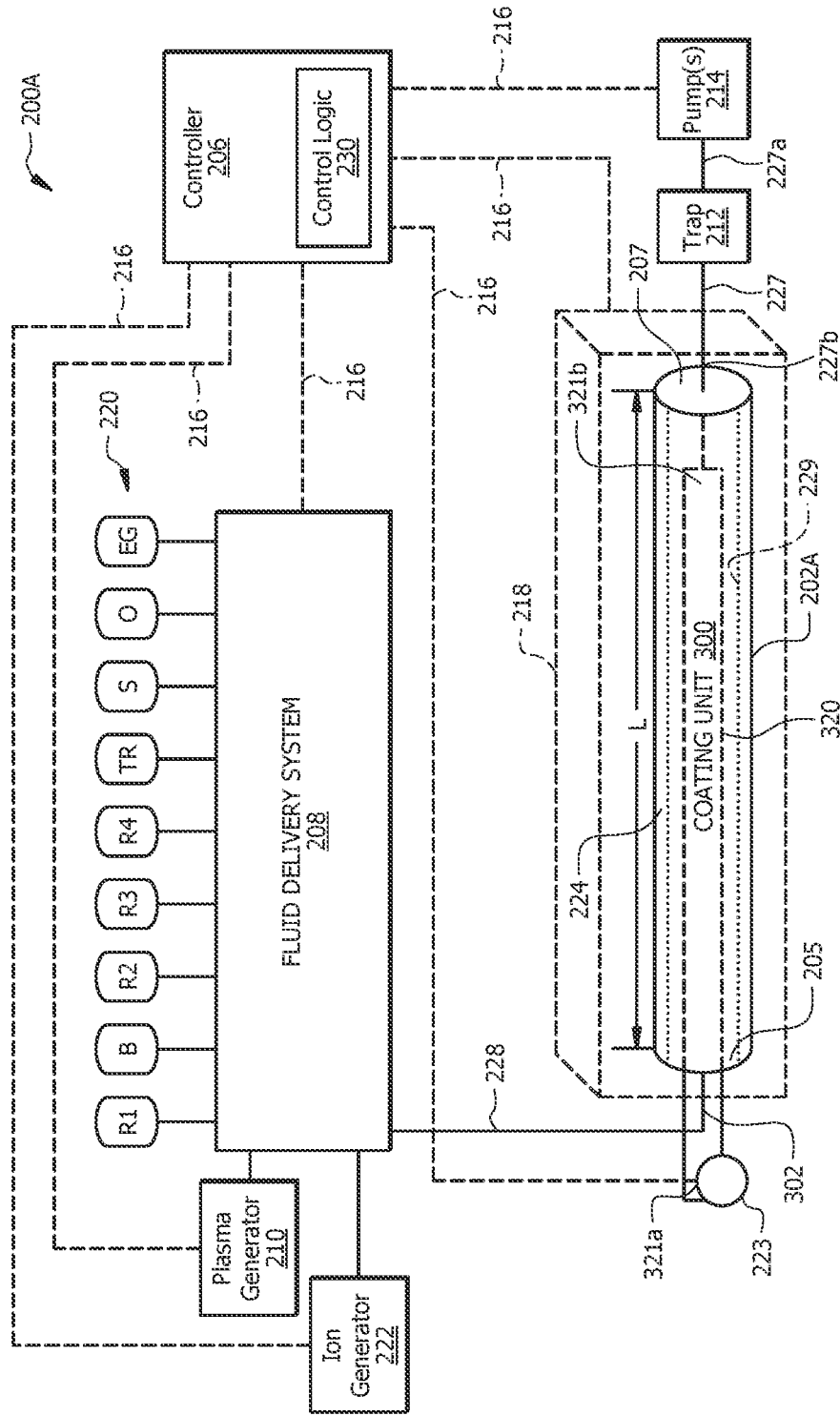
FIG. 1B is a block diagram of an example of a well tool coating system according to some aspects.

For example and with reference to FIG. 1B, a well tool coating system 200A according to this disclosure can be positioned at the wellsite 100 (FIG. 2) for applying coatings on interior surfaces 229 of a well tool 202A at the wellsite 100. The well tool coating system 200A can apply the coatings to the well tool 202A at any suitable time, such as before the well tool 202A performs a downhole operation, after the well tool 202A performs a downhole operation, or both. The well tool coating system 200A is capable of applying the coatings to the well tool 202A using multiple types of surface coating processes, such as, without limitation, ALD and/or CVD.

The coating system 200/well tool coating system 200A includes a surface coating unit 300 ("coating unit") that is sized and shaped to be positioned within an interior region (also referred to herein as an "interior volume") 224 of the tool 202/well tool 202A. The coating unit 300 includes a fluid flow conduit, which may further comprise an elongated member 320 with one or more outlets or ports 314. The outlet(s) or ports 314 can supply fluids to one or more zones 312 formed inside the tool 202/well tool 202A by barriers 316, for example, to perform a surface coating process within the one or more zones 312. This is described in greater detail below with reference to FIGS. 3-6B.

Still referring to FIG. 1A and FIG. 1B, the coating unit 300 can be coupled to an actuator 223, such as a motor. The actuator 223 can move (e.g., translate and rotate) the coating unit 300 within the tool 202/well tool 202A. Alternatively, the coating unit 300 can remain fixed and the actuator 223 can be coupled to the tool 202/well tool 202A, in order to move the tool 202/well tool 202A (e.g., translate and rotate) relative to the coating unit 300. Either way, the actuator 223 can move the coating unit 300 and the tool 202/well tool 202A relative to one another. This can enable the coating unit 300 to apply fluids at various angles and to various locations within (e.g., on an interior surface adjacent an interior volume of) the tool 202/well tool 202A. For example, the actuator 223 can translate the coating unit 300 back-and-forth (e.g., side-to-side, for example parallel to central axis C in a direction indicated by arrow A2 (FIG. 4, described hereinbelow) of tool 202/well tool 202A) through the tool 202/well tool 202A and/or rotate the coating unit 300 (e.g., about central axis C in a direction indicated by arrow A1 in FIG. 4) of tool 202/well tool 202A to apply a surface coating process, such as, without limitation, an ALD and/or a CVD process, to various locations in (e.g., on an interior surface adjacent an interior volume of) the tool 202/well tool 202A. Alternatively or additionally, by way of further example, the or another actuator 223 can translate the tool 202/well tool 202A back-and-forth (e.g., side-to-side along central axis C in the direction indicated by arrow A2) about coating unit 300 and/or rotate the tool 202/well tool 202A around coating unit 300, for example about the central axis C of tool 202/well tool 202A (e.g., in the direction indicated by arrow A1 in FIG. 4) to apply a surface coating process, such as, without limitation, an ALD and/or a CVD process, to various locations in (e.g., on an interior surface adjacent an interior volume of) the tool 202/well tool 202A.

After the coating unit 300 is positioned inside the tool 202/well tool 202A, the surface coating system 200/well tool coating system 200A can apply one or more coatings of material to interior surfaces 229 inside the tool 202/well tool 202A using a fluid delivery system 208, such as a gas supply system. The fluid delivery system 208 is coupled to sources 220 (e.g., tanks or containers) of gases and the coating unit 300 by conduits or "delivery line" 228 (e.g., pipes, tubing, etc.). The fluid delivery system 208 can selectively couple selected ones of the sources 220 of gases to the coating unit 300 to implement a surface coating process inside the tool 202/well tool 202A. The fluid delivery system 208 can include any of a variety of mechanical flow control elements that fluidly couple one or more sources 220 to the coating unit 300, such as any combination of supply lines, manifolds, valves, pumps, and/or other flow control element(s).

Figure 3:
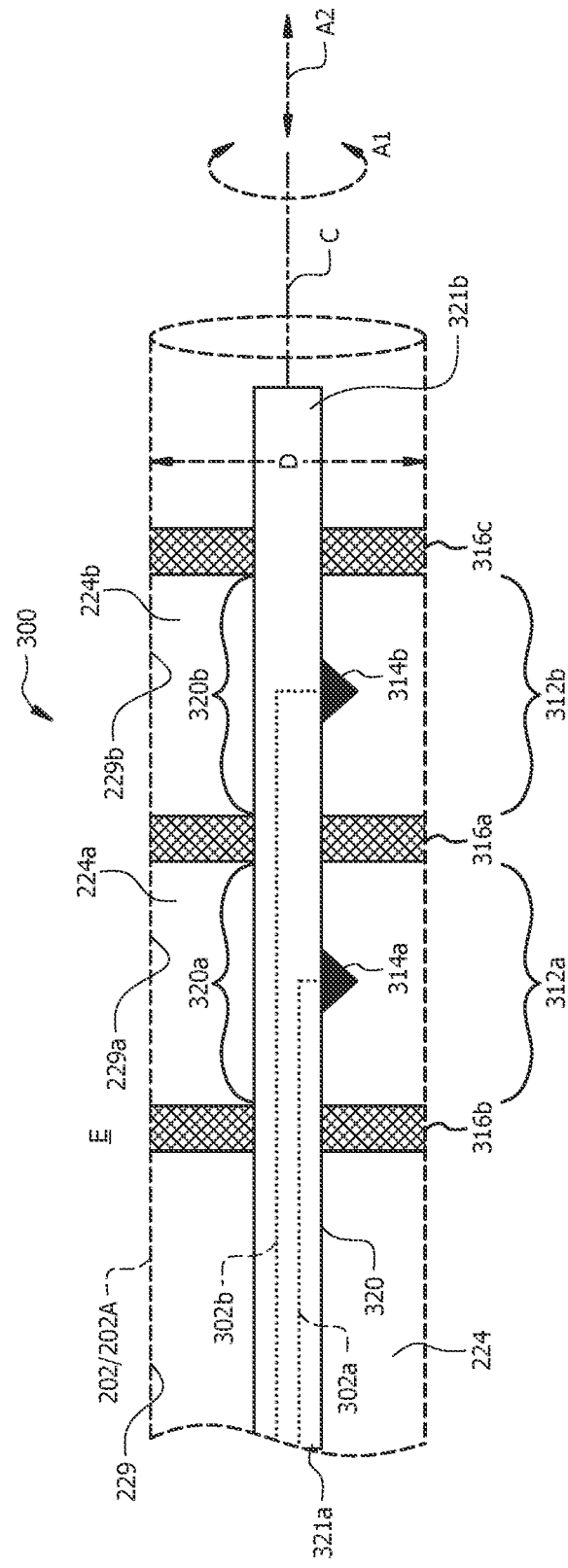
FIG. 3 is a cross-sectional side view of an example of a surface coating unit within a tool (e.g., a well tool) according to some aspects.

With reference to FIG. 1A and FIG. 1B and FIG. 3, a surface coating device or system 200/well tool coating device or system 200A according to this disclosure for coating a surface 229 adjacent an interior region or volume 224 disposed within a housing, apparatus, or tool 202/well tool 202A, wherein the interior volume 224 has an inlet 205 extending through the housing, apparatus, or tool 202/well tool 202A such that the interior volume 224 is accessible from an exterior E of the housing, apparatus, or tool 202A via the inlet 205, can comprise: an elongated member 320 having a first end 321A and a second end 321b and at least one fluid flow path or conduit 302 extending from the first end 321a of the elongated member 320 to the second end 321b of the elongated member 320, wherein the elongated member 320 is fluidically coupled to at least one delivery line 228 proximate the first end 321a of the elongated member 320 and wherein the elongated member 320 is configured for placement in the interior volume 224 via the inlet 205 of the housing, apparatus, or tool 202/well tool 202A; a plurality of reactant gas sources 220 comprising reactant gases for one or more surface coating processes and fluidically coupled to the at least one delivery line 228 (e.g., via conduit(s) 228); and a barrier 316 (e.g., a lone barrier or a first barrier 316a) disposed about the elongated member 320 and configured to divide the interior volume 224 into a first zone 312a and a second zone 312b, wherein the first barrier 316a further divides the elongated member 320 into a first portion 320a corresponding with the first zone 312a and a second portion 320b corresponding with the second zone 312b. With reference to FIG. 3, which will be described in more detail hereinbelow, a surface coating device or system 200/well tool coating device or system 200A according to this disclosure can further comprise one or more outlets or ports 314, for example, a first port 314a disposed within the first portion 320a of the elongated member 320a and in fluid communication with the at least one fluid flow path or conduit 302 (e.g. with a first fluid flow path or conduit 302a) of the elongated member 320, the first port 314a configured to introduce one or more of the reactant gases, the plasma, or both to the first zone 312a such that upon reaction of the one or more reactant gases, optionally in the presence of the plasma, a coating is formed on all or a portion 229a of the surface adjacent the interior volume 224 of the housing, apparatus, or tool 202/well tool 202A within the first zone 312a; and a second port 314b disposed within the second portion 320b of the elongated member 320 and in fluid communication with the at least one fluid flow path or conduit 302 (e.g., second fluid flow path or conduit 302b) of the elongated member 320, the second port 314b configured to introduce one or more of the reactant gases, the plasma, or both to the second zone 312b such that upon reaction of the one or more reactant gases, optionally in the presence of the plasma, a coating is formed on all or a portion of the surface 229b of the interior volume 224 of the housing, apparatus, or tool 202/well tool 202A within the second zone 312b.

A surface coating device or system 200/well tool coating device or system 200A can further comprise: a second barrier 316b disposed about (e.g., along or surrounding) the elongated member 320, the second barrier 316 spaced (e.g., axially or radially) a distance from the first barrier (e.g., in a direction of the first end 321a of the elongated member 320) and configured to enclose the first zone 312a between the first barrier 316a and the second barrier 316b; and/or a third barrier 316c disposed about (e.g., along or surrounding) the elongated member 320 (e.g., the third barrier 316c spaced a distance from the first barrier 316a in a direction of the second end 321b of the elongated member 320) and configured to enclose the second zone 312b between the first barrier 316a and the third barrier 316c.

A surface coating device or system 200/well tool coating device or system 200A according to this disclosure can optionally further comprise a plasma generator 210 configured to generate a plasma and fluidically coupled to the at least one delivery line 228, and/or can optionally further comprises a pump 214 fluidically coupled to a first end 227a of a vacuum line 227, wherein a second end 227b of the vacuum line 227 is fluidically coupled to the elongated member 320 proximate the second end 321b of the elongated member 320 (or alternatively, proximate the first end 321a of the elongated member). The pump 214 can be configured to create a vacuum in the vacuum line 227, said vacuum effective to evacuate a residual gas from the first zone 312a, the second zone 312b, the at least one fluid flow path or conduit 302 of the elongated member 320, or combinations thereof. The residual gas can comprise, for example, unreacted reactant gases, buffer gas, solvent S, oxidizer O, etching gas EG, or a combination thereof.

The housing, apparatus, or tool 202/well tool 202A can have an outlet 207 extending through the housing, apparatus, or tool 202/well tool 202A such that the interior volume 224 is accessible from an exterior E of the housing, apparatus, or tool 202/well tool 202A via the inlet 205 and the outlet 207 of the housing, apparatus, or tool 202/well tool 202A, wherein the delivery line 228 is configured to pass through the inlet 205 of the housing, apparatus, or tool 202/well tool 202A when fluidically coupled to the elongated member 320, and wherein the vacuum line 227 is configured to pass through the outlet 207 of the housing, apparatus, or tool 202/well tool 202A when fluidically coupled to the elongated member 320.

The interior volume 224 and/or the elongated member 320 can have an aspect ratio that is less than or equal to about 0.5, 0.05, or 0.005, wherein the aspect ratio is an average width W1 of the interior volume 224 and/or an average width W2 of the elongated member 320, respectively, divided by an average length L1 or L2, respectively, thereof.

Each zone 312 can comprise a dedicated delivery line 228 and/or associated fluid flow path or conduit 302. Likewise, each zone 312 can comprise a dedicated vacuum line 227, for example fluidically coupled to the first zone 312a, the second zone 312b, the at least one fluid flow path or conduit 302 of the elongated member 320, or combinations thereof.

As described with reference to FIGS. 1A and 1B, the surface coating device or system 200/well tool coating device or system 200A comprises at least one fluid flow conduit fluidically coupled to the plurality of reactant gas sources and extending from the plurality of gas sources to the volume within the housing. The coating unit 300 generally refers to the portion of the fluid flow conduit that extends from an exterior into an interior volume of the housing during a surface coating process. The coating unit 300 may comprise a unitary structure with the one or more delivery lines 228 (e.g., a long, continuous flexible pipe or tubing) or the coating unit 300 may comprise two or more components fluidically coupled such as, without limitation, one or more delivery lines 228 and, without limitation, an elongated member 320. Although described herein as an "elongated member", elongated member 320 need not have any particular shape, so long as it provides for the spatial application of reactant gases within multiple zones 312, as described herein. The elongated member may be rigid (e.g., a solid pipe), flexible (e.g., flexible metal tubing, rubber tubing, etc.), or a combination thereof. For example, the elongated member may comprise an outer pipe (e.g., rigid or flexible pipe) having two or more flow paths 302 disposed therein, wherein the two or more flow paths may comprise flow paths structurally segregated within the pipe (e.g., a pipe having a central divider running along the length thereof to form two flow paths each having a 180 degree cross section) and/or separate flow tubes 302 disposed within the pipe housing (e.g., a rigid pipe outer housing having two or more flow tubes 302 (e.g., flexible tubing) disposed therein). It should be understood that reference to at least one fluid flow conduit fluidically coupled to the plurality of reactant gas sources and extending from the plurality of gas sources to the volume within the housing includes any physical structure to provide fluid flow from the plurality of reactant gas sources, the plasma source, and/or the ion source to an interior surface of the housing during a surface coating process of the type described herein. Further it should be understood that reference herein to the use of an elongated member, for example with reference to the embodiments shown in the Figures, should not be construed as limiting the presently disclosed concepts, and in particular embodiments described with reference to an elongated member can be carried out in the absence of an elongated member via use of a unitary structure comprising the coating unit 300 and the one or more delivery lines 228 (e.g., a long, continuous flexible pipe or tubing).

As described further hereinbelow, the surface coating device or system 200/well tool coating device or system 200A can further comprising an ion generator 222, configured for applying an atomic layer etching (ALE) process to the interior surface 229; a heating unit 218 in thermal communication with the housing, apparatus, or tool 202/well tool 202A and in electronic communication with a controller 206 to control heating of the housing, apparatus, or tool 202/well tool 202A while controlling delivery of reactant gas to the interior volume 224; the controller 206 in communication with the plurality of reactant gas sources 220 and operable to control delivery of reactant gas to the interior volume 224 and supply a sequence of the reactant gases to the interior volume 224 of the housing, apparatus, or tool 202/well tool 202A to perform one or more surface coating processes or techniques on all or a portion of the interior volume 224; and/or a trap 212 upstream of the pump 214 and downstream of the housing, apparatus, or tool 202/well tool 202A, wherein the trap 212 is operable as a filter and/or a second auxiliary coating chamber.

For example, the trap 212 can be used as a filter prior to the pump 214. Alternatively or additionally, a trap 212 (e.g., from which 'filter element(s)' thereof have been removed) can be utilized as an auxiliary coating chamber. This auxiliary chamber can be utilized to coat additional 'pieces' of the housing, apparatus, or tool 202/well tool 202A, for example, when these pieces are individual elements small enough to fit into the trap (e.g., tool windows, valves, plugs, etc.). In such instances, the pieces can be inserted within the trap 212 for coating according to the methods described herein.

As detailed further hereinbelow, the one or more surface coating processes can comprise, without limitation, chemical vapor deposition (CVD), atomic layer deposition (ALD), or both. The coating device or system 200/well tool coating device or system 200A can be portable. In such embodiments, the coating device or system 200/well tool coating device or system 200A can further comprises a portable conveyance (e.g., trailer, skid, vehicle, etc.) configured to transport the coating system or device 200/well tool coating system or device 200A to a worksite (e.g., wellsite 100 of FIG. 2).

One example of a surface coating process that the surface coating system 200/well tool coating system 200A can apply to an interior surface 229 of the tool 202/well tool 202A is ALD. ALD generally involves four main steps that are repeated to deposit a coating of a desired thickness on a surface: (i) a first step involving introducing a first reactant gas R1 into a zone 312 containing a surface (e.g., a portion of interior surface 229 within the zone 312, which may or may not already have a coating layer thereupon) such that at least some of the reactant gas chemically bonds with the surface (e.g., portion of interior surface 229 within the zone 312, which may or may not already have a coating layer thereupon) to form a reactive layer, (ii) a second step involving removing leftovers of the first reactant gas or gaseous byproducts from the zone 312, (iii) a third step involving introducing a second reactant gas R2 into the zone 312 such that at least some of this second reactant gas R2 bonds with the reactive layer from the first step to form a monolayer, and (iv) a fourth step involving removing leftovers of the second reactant gas R2 or gaseous byproducts from a zone 312. Some or all of these steps can be repeated as many times as is required to obtain the desired number of coating layers and the desired thickness of each layer.

To implement an ALD process, the surface coating system 200/well tool coating system 200A includes at least a first reactant gas R1, a second reactant gas R2, and a buffer gas B (e.g., an inert gas such as nitrogen gas). These are represented in FIGS. 1A/1B as reactant gas R1, reactant gas R2, and buffer gas B, respectively, stored in gas sources 220. Reactant gas R1 and buffer gas B can be used in the first step of the ALD process. The buffer gas B can be used alone in the second step of the ALD process (e.g., to purge a zone of reactant gas R1). The reactant gas R2 and the buffer gas B can be used in the third step of the ALD process. The buffer gas B can again be used alone in the fourth step of the ALD process. While this example involves using the same buffer gas B throughout the steps, other examples can involve using different buffer gases for various steps. Still other examples may exclude the buffer gas B altogether in some of the steps (e.g., steps two and/or four) and/or use a pump 214 for performing these steps. For example, the surface coating system 200/well tool coating system 200A can include pump 214 (e.g., a vacuum pump) coupled to the coating unit 300 for suctioning reactant gases, gaseous byproducts, and/or buffer gases out of the zones 312 (e.g., in order to implement the second and fourth steps of the ALD process).

The surface coating system 200/well tool coating system 200A can include any suitable combination of reactant gases and buffer gases for performing the ALD process. For example, the first and second reactant gases R1-R2 can include trimethyl-aluminum and water, respectively, for producing coating layers of aluminum oxide inside the tool 202/well tool 202A. Alternatively, the first and second reactant gases R1-R2 can form coatings of titanium dioxide, hafnium dioxide, zirconium dioxide, tantalum pentoxide, or other group IVB metal oxides and their silicate alloys, inside the tool 202/well tool 202A. In some examples, the buffer gas B can include nitrogen, helium, neon, xenon, argon, or any other inert gas that does not chemically react with the reactant gases and the surface (e.g., portion of interior surface 229 within the zone 312) to be coated.

Still referring to FIGS. 1A/1B, another example of a surface coating process that the coating system 200/well tool coating system 200A can apply to an interior surface 229 of the tool 202/well tool 202A is CVD. CVD can generally involve introducing at least one reactant gas into a zone 312 such that it chemically reacts with a surface (e.g., a portion of the interior surface 229 within the zone 312, which may or may not already have a coating layer thereupon). In some examples, CVD can involve introducing two or more reactant gases simultaneously and continuously into the zone 312 such that they chemically react with a surface (e.g., a portion of interior surface 229 within the zone 312, which may or may not already have a coating layer thereupon) within zone 312.

To implement the CVD process, the coating system 200/well tool coating system 200A can include at least a third reactant gas, which is represented in FIG. 1A/1B as reactant gas R3. The coating system 200/well tool coating system 200A may also include a fourth reactant gas (or more gases) for implementing the CVD process. The fourth reactant gas is represented in FIG. 1A/1B as R4. The third and fourth reactant gases R3/R4 can each include any suitable reactant gas for performing a CVD process. For example, the third reactant gas R3 or the fourth reactant gas R4 can be configured to form coatings of carbide, silicon carbide, or aluminum oxide inside the tool 202/well tool 202A. The third/fourth reactant gases R3/R4 are stored in gas sources 220, from which they can be supplied to zones 312 inside the tool 202/well tool 202A, for example via conduit 228, delivery line 228, and one or more flow paths or conduits 302.

The thickness of the coating layer (e.g., an ALD coating layer, a CVD coating layer, or a combination thereof) can be in the range of from about 1, 5, or 10 nanometers to about 10, 20, 30, 40, or 50 microns or more.

To control the surface coating processes, the surface coating system 200/well tool coating system 200A can include a controller 206 coupled to the fluid delivery system 208 by control lines 216. The controller 206 may also be coupled to the actuator 223 by one or more control lines 216 for rotating and/or translating the coating unit 300. In embodiments, the or another actuator 223 is coupled with housing, apparatus, or tool 202/well tool 202A, and controller 206 may be coupled to the or the another actuator 223 by one or more control lines 216 for rotating and/or translating the housing, apparatus, or tool 202/well tool 202A. The controller 206 can actuate the fluid delivery system 208 via the control lines 216 to implement the ALD process, the CVD process, and/or another surface coating process. For example, the controller 206 can sequentially actuate valves inside the fluid delivery system 208 such that first/second reactant gases R1/R2 flow from their sources 220 to the zone(s) 312 in order to perform the ALD process. The controller 206 can actuate valves inside the fluid delivery system 208 such that third/fourth reactant gases R3/R4 (e.g., simultaneously) flow from their sources 220 to the zone(s) 312 in order to perform the CVD process. The controller 206 may further be coupled to the pump 214 by one or more control lines 216 for suctioning gases (e.g., reactant gases, buffer gases, byproduct gases) out of the tool 202/well tool 202A and through a trap 212 that serves as a filter. Alternatively, the pump 214 can be separately controlled independently of the controller 206.

The controller 206 is a physical device that can operate the fluid delivery system 208 to control fluid flow into the tool 202/well tool 202A. The controller 206 can be a mechanical controller, a hydraulic controller, an electrical controller, or any combination of these. In an example in which the controller 206 is a mechanical controller, the control lines 216 can be links or cables and the fluid delivery system 208 can include mechanically controlled pumps, valves, etc. In an example in which the controller 206 is a hydraulic controller, the control lines 216 can be hydraulic lines and the fluid delivery system 208 can include hydraulically controlled pumps, valves, etc. In an example in which the controller 206 is an electrical controller, the control lines 216 can be wires and the fluid delivery system 208 can include electrically controlled pumps, valves, etc.

In some examples, the controller 206 includes a processing device communicatively coupled to a memory device for executing control logic 230 stored on the memory device. Non-limiting examples of the processing device include a Field-Programmable Gate Array (FPGA), an application-specific integrated circuit (ASIC), a microprocessor, etc. The memory device can be non-volatile and may include any type of memory device that retains stored information when powered off. Non-limiting examples of the memory device include electrically erasable and programmable read-only memory (EEPROM), flash memory, or any other type of non-volatile memory. In some examples, at least some of the memory device can includes a non-transitory computer-readable medium, such as a magnetic disk, memory chip, read only memory (ROM), random-access memory (RAM), an ASIC, optical storage, or any other medium from which a computer processor can read the control logic 230, which can include program code for automating a sequence of steps for performing an ALD process, a CVD process, and/or any another surface coating process or processes.

The surface coating system 200/well tool coating system 200A can include other components as well. For example, the surface coating system 200/well tool coating system 200A can also include a heating unit to assist in performing a surface coating process. For example, the surface coating system/well tool coating system 200A can include heating unit 218, such as an oven or heating jacket. The heating unit 218 can receive a housing, apparatus, or tool 202/well tool 202A therein and apply thermal energy to the housing, apparatus, or tool 202/well tool 202A. Alternatively, the surface coating system 200/well tool coating system 200A can include a heating unit coupled to the coating unit 300, such that the heating unit can be positioned inside the housing, apparatus, or tool 202/well tool 202A. In one such example, the heating unit can include a resistive element coupled to the coating unit 300 for radiating thermal energy to the interior region 224 of the housing, apparatus, or tool 202/well tool 202A.

The surface coating system/well tool coating system 200A may further include a solvent S, an oxidizer O, or both. These are represented in FIG. 1A/1B as solvent S and oxidizer O. A solvent is a substance that can dissolve another substance. Examples of solvents include toluene, xylene, benzene, carbon tetrachloride, tetrahydrofuran, dichloromethane, and d-limonene. An oxidizer is a substance that can oxidize another substance (e.g., cause the other substance to lose electrons). Examples of oxidizers include sulfur and nitrous oxide. The surface coating system 200/well tool coating system 200A can operate the fluid delivery system 208 to flush the interior region 224 of the housing, apparatus, or tool 202/well tool 202A with the solvent S, the oxidizer O, or both via the coating unit 300. The surface coating system 200/well tool coating system 200A may flush the interior region or volume 224 (e.g., the portion of the interior region or volume 224 within zone 312) with one or both of these prior to performing a surface coating process in the housing, apparatus, or tool 202/well tool 202A. This can prepare the interior region or volume 224 of the housing, apparatus, or tool 202/well tool 202A for the surface coating process and help promote bonding.

In some examples, the surface coating system 200/well tool coating system 200A further includes one or more topical reagents TR. These are represented in FIG. 1A/1B as topical reagents TR. A topical reagent TR is a substance configured to chemically react with a coating layer deposited inside the housing, apparatus, or tool 202/well tool 202A in order to change a material characteristic of the coating layer. Examples of material characteristics can include wettability, stiffness, strength, ductility, hardness, density, electrical conductivity, thermal conductivity, and corrosion resistance. The surface coating system 200/well tool coating system 200A can operate the fluid delivery system 208 to apply the topical reagent TR to one or more coating layers inside the housing, apparatus, or tool 202/well tool 202A via the coating unit 300. This can adjust one or more material characteristics of the coating layer(s). As a particular example, the surface coating system 200/well tool coating system 200A can apply a topical reagent TR that includes hydrochloric acid to a coating layer inside the housing, apparatus, or tool 202/well tool 202A. If the coating layer is formed from hydrogen, the hydrochloric acid can burn off at least some of the hydrogen to improve the wettability of the coating layer.

The coating system 200/well tool coating system 200A can also include one or more etching gases EG and an ion generator 222 for applying an atomic layer etching (ALE) process inside the housing, apparatus, or tool 202/well tool 202A. ALE can be viewed as the reverse of the layer deposition process of ALD, in the sense that ALE uses sequential and self-limiting reactions to remove thin layers of material from a surface. The surface coating system 200/well tool coating system 200A can operate the fluid delivery system 208 to apply the ALE process, for example, in order to pre-treat a surface adjacent the interior volume 224 within the zone(s) 312 prior to a surface coating process or to reduce the thickness of a coating layer resulting from a surface coating process.

ALE can generally involve four main steps that can be repeated: (i) a first step involving applying an etching gas EG to a surface 229 within a zone 312 such that the surface chemically reacts with and adsorbs the etching gas, and (ii) a second step involving purging the etching gas EG and any gaseous byproducts from zone 312, (iii) a third step involving applying low-energy ions to the portions of the surface that chemically reacted with the etching gas EG in order to etch away (e.g., remove) those portions, and (iv) a fourth step involving purging byproducts resulting from the third step. The controller 206 can implement (i) by actuating the fluid delivery system 208 to supply the etching gas EG from a source 220 to the zone(s) 312. Examples of the etching gas EG can include argon, fluorine, chlorine, boron trichloride, and hydrogen bromide. The controller 206 can implement steps (ii) and/or (iv) by actuating the pump 214, actuating the fluid delivery system 208 to supply a buffer gas (e.g., buffer gas B) to within the zone(s) 312, or both of these. The controller 206 can implement (iii) by actuating an ion generator 222, which can supply the low-energy ions to the zone(s) 312. Some or all of these steps can be repeated as many times as is required, or may be absent, as described hereinbelow.

For example, a surface coating system or device 200/well tool coating system or device 200A can comprise an ion generator 222 configured for applying an atomic layer etching (ALE) process to all or a portion of the surface 229 of the interior volume 224 of the housing, apparatus, or tool 202/well tool 202A within one or more zone(s) 312 (e.g., all or a portion of the surface 229a of the interior volume 224a of the housing, apparatus, or tool 202/well tool 202A within the first zone 312a, and/or all or a portion of the surface 229b of the interior volume 224b of the housing, apparatus, or tool 202/well tool 202A within the second zone 312b, and so on.

While the surface coating system 200/well tool coating system 200A shown in FIG. 1A/1B includes a certain amount and arrangement of components for illustrative purposes, other examples can include more, fewer, or a different arrangement of these components. For example, the surface coating system 200/well tool coating system 200A can include more or fewer control lines, reactant gases, buffer gases, topical reagents, solvents, oxides, or any combination of these. In one such example, the surface coating system 200/well tool coating system 200A includes three reactant gases (e.g., first reactant gas R1, second reactant gas R2, and third reactant gas R3), whereby at least one of the three reactant gases (e.g., second reactant gas R2) is common to at least two surface coating processes. Also, some examples may exclude the controller 206, the trap 212, the pump 214, the heating unit 218, or any combination of these. Further, while some examples are described herein in relation to ALD and/or CVD, other examples can involve other types of surface coating processes.

Figure 4:
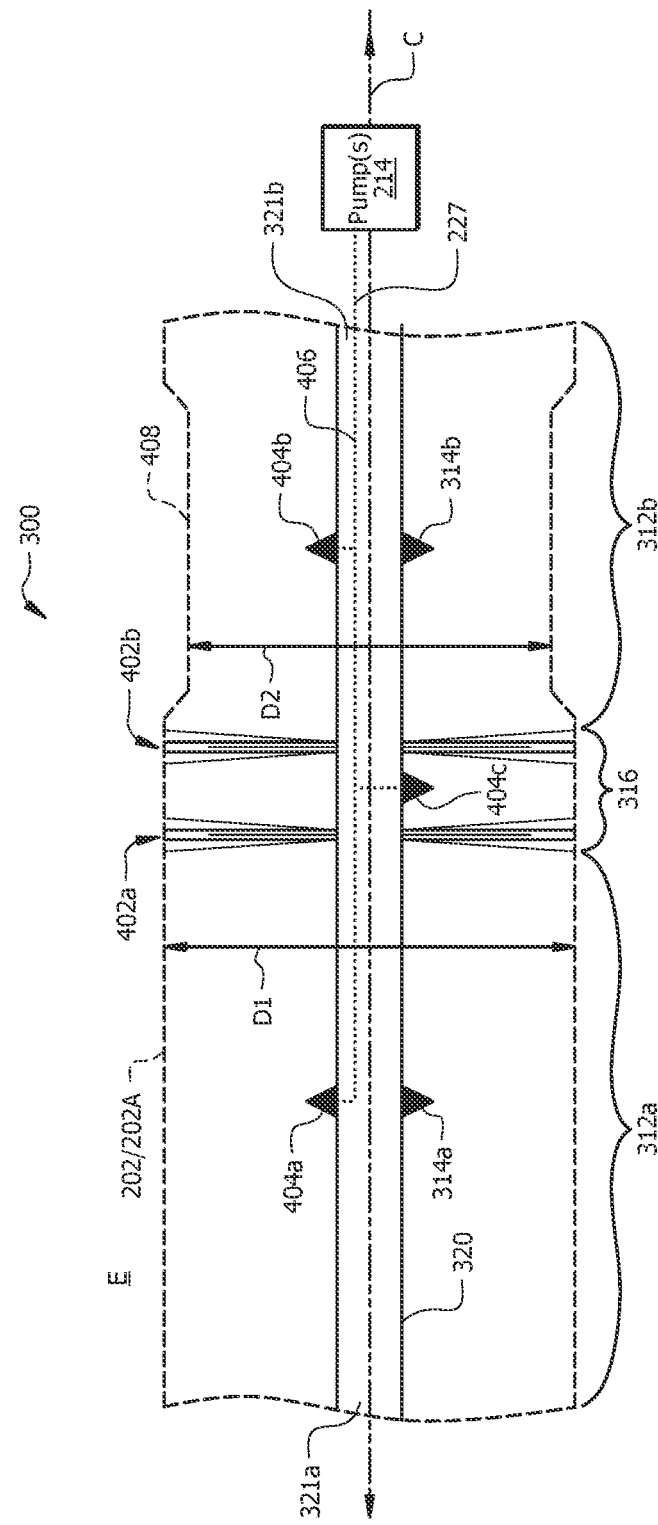
FIG. 4 is a cross-sectional side view of another example of a surface coating unit within a tool (e.g., a well tool) according to some aspects.
Figure 5:
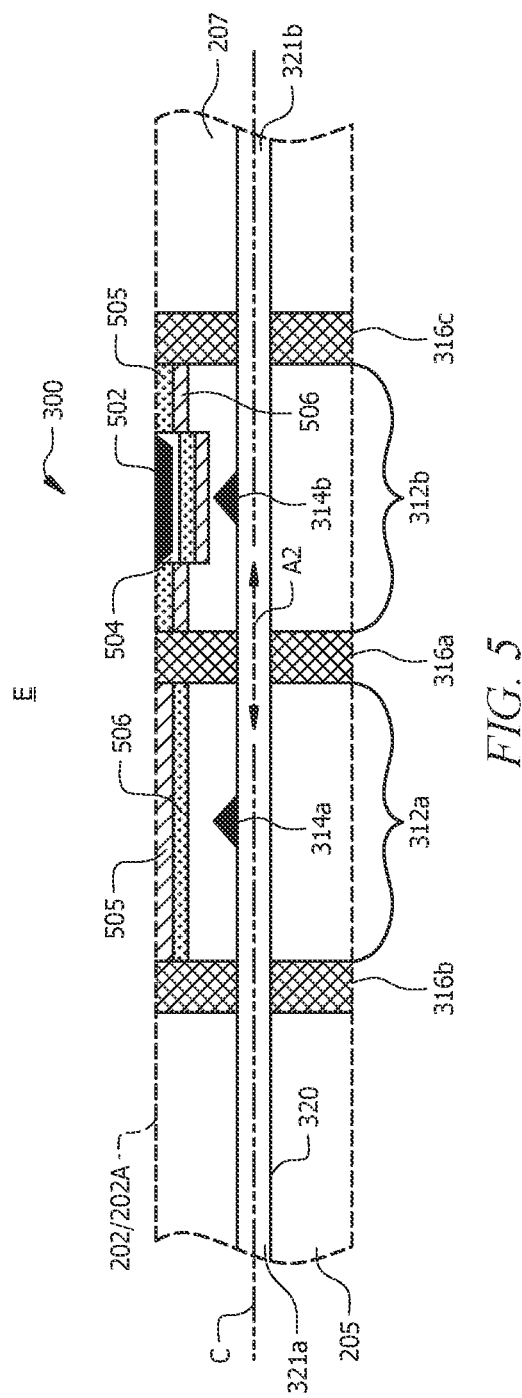
FIG. 5 is a cross-sectional side view of an example of coating layers deposited inside a tool (e.g., a well tool) by a surface coating unit according to some aspects.

FIG. 3 is a cross-sectional side view of an example of a surface coating unit 300 within housing, apparatus, or tool 202/well tool 202A according to some aspects, FIG. 4 is a cross-sectional side view of another example of a surface coating unit 300 within a tool 202/well tool 202A according to some aspects, and FIG. 5 is a cross-sectional side view of an example of coating layers deposited inside a tool 202/well tool 202A by a surface coating unit 300 according to some aspects. The coating unit 300 is depicted in solid lines and the housing, apparatus, or tool 202/well tool 202A is depicted in dashed lines in FIGS. 3-6B.

The coating unit 300 includes an elongated member 320 (e.g., an elongated cylindrical body such as a length of a pipe or tube having a circular or oval cross-sectional shape). The elongated member 320 can be flexible (e.g., a flexible hose such as elastomeric or rubber hose) or rigid (e.g., a rigid tubing or pipe such a metal tubing or pipe). The elongated member 320 and the housing, apparatus, or tool 202/well tool 202A are movable relative to one another. For example, and without limitation, an actuator 223 (FIG. 1A/1B) can translate the elongated member 320 along the central axis C of the housing, tool, or apparatus 202/well tool 202A (e.g., as depicted by arrow A2), rotate the elongated member 320 around the central axis C (e.g., as depicted by arrow A1), or both of these.

The elongated member 320 includes one or more outlets or ports 314 (e.g., first outlet or port 314a and second outlet or port 314bb). The outlets or ports 314 can supply fluids to one or more zones 312 (e.g., first zone 312a and second zone 312b, respectively) in the tool 202/well tool 202A via fluid flow paths or conduits 302 (e.g., first fluid flow path or conduit 302a and second fluid flow path or conduit 302b) coupled to fluid sources (e.g., the sources 220 of FIG. 1A/1B). Examples of the fluids can include, without limitation, reactant gases, buffer gases, topical reagents, oxidizers, solvents, or any combination of these, for performing any of the processes discussed above. Although in FIG. 3 the elongated member 320 includes a single outlet 314 in each of the zones 312 (e.g., first outlet or port 314a in first zone 312a and second outlet or port 314b in second zone 312b), other examples can include any number and configuration of outlets or ports 314 in each of the zones 312.

The zones 312 are defined on the ends by barriers 316 (e.g., first barrier 316a, second barrier 316b, and third barrier 316c in the embodiment of FIG. 3). The barriers 316 physically isolate the zones 312 from one another to prevent intermixing of the fluids supplied to the zones 312. The barriers 316 can include any combination of solid, liquid, or gaseous elements. For example, a first barrier 316a can include an outlet or port positioned between first outlet or port 314a and second outlet or port 314b for expelling of a gas (e.g., a buffer gas). This gas can operate to prevent intermixing of the fluids in the first zones 312a and the second zone 312b. As another example, a first barrier 316a can include a seal, such as a ferrofluidic seal; a packer, such as a gel packer; or bristles (discussed further hereinbelow with reference to FIG. 4), such as rubber bristles; or any combination of these; or the like.

Each of the one or more barrier(s) 316 (e.g., the first barrier 316a, the second barrier 316b, the third barrier 316c, and/or a fourth barrier 316d (FIG. 6B, described hereinbelow) can comprise a physical barrier or a fluidic barrier. The physical barrier can comprise, for example, an elastomer seal, bristles, an inflatable seal, a packer such as a gel packer, a wiper plug structure, or a combination thereof. The fluidic barrier can comprise a barrier or purge gas, a ferro fluid, or a combination thereof. The barrier(s) 316 can be configured to centralize the elongated member 320 within the interior volume 224.

As depicted in the embodiment of FIG. 3, the surface coating system or device 200/well tool coating system or device 200A for coating a surface 229 of an interior volume 224 disposed within a housing, apparatus, or tool 202/well tool 202A, wherein the interior volume 224 has an inlet 205 extending through the housing, apparatus, or tool 202/well tool 202A such that the interior volume 224 is accessible from an exterior E of the housing, apparatus, or tool 202/well tool 202A via the inlet 205, can thus comprise: an elongated member 320 having a first end 321a and a second end and at least one fluid flow path 302 extending from the first end 321a toward the second end 321b (also referred to as "extending to" the second end 321b, albeit the conduit or flow path 302 need not extend the entirety of the length from first end 321a of elongated member 320 to second end 321b of elongated member 320), wherein the elongated member 320 is fluidically coupled to at least one delivery line 228 proximate the first end 321a of the elongated member 320 and wherein the elongated member 320 is configured for placement in the interior volume 224 via the inlet 205 of the interior volume 224; a plurality of reactant gas sources 220 comprising reactant gases for one or more surface coating processes and fluidically coupled to the at least one delivery line 228 (e.g., via conduit(s) 228); optionally, a plasma source such as plasma generator 210 configured to generate a plasma and fluidically coupled to the at least one delivery line 228; a first barrier 316a disposed about the elongated member 320 and configured to divide the interior volume 224 into a first zone 312a and a second zone 312b, wherein the first barrier 316a further divides the elongated member 320 into a first portion 320a corresponding with the first zone 312a and a second portion 320b corresponding with the second zone 312b; a first outlet or port 314a disposed within the first portion 320a of the elongated member 320 and in fluid communication with the at least one fluid flow path 302 of the elongated member 320, the first outlet or port 314a configured to introduce one or more of the reactant gases, the plasma, or both to the first zone 312a such that upon reaction of the one or more reactant gases, optionally in the presence of the plasma, a coating is formed on all or a portion of the surface 229a of the interior volume 224a of the housing, apparatus, or tool 202/well tool 202A within the first zone 312a; a second outlet or port 314b disposed within the second portion 312b of the elongated member 320 and in fluid communication with the at least one fluid flow path 302 of the elongated member 320, the second outlet or port 314b configured to introduce one or more of the reactant gases, the plasma, or both to the second zone 312b such that upon reaction of the one or more reactant gases, optionally in the presence of the plasma, a coating is formed on all or a portion of the surface 229b of the interior volume 224b of the housing, apparatus, or tool 202/well tool 202A within the second zone 312b; and optionally a pump 214 fluidically coupled to a first end 227a of a vacuum line 227, wherein a second end 227a of the vacuum line 227 is fluidically coupled to the elongated member 320 proximate the second end 321b of the elongated member 320 (or alternatively, proximate the first end 321a of the elongated member), wherein the pump 214 is configured to create a vacuum in the vacuum line 227, said vacuum effective to evacuate a residual gas from the first zone 312a, the second zone 312b, the at least one fluid flow path 302 of the elongated member 320, or combinations thereof. As depicted in FIG. 3, the surface coating system or device 200/well tool coating system or device 200A can further comprise: a second barrier 316b surrounding the elongated member 320, the second barrier 316b spaced a distance from the first barrier 316a in a direction of the first end 321a of the elongated member 320 and configured to enclose the first zone 312a between the first barrier 316a and the second barrier 316b; and/or a third barrier 316c surrounding the elongated member 320, the third barrier 316c spaced a distance from the first barrier 316a in a direction of the second end 321b of the elongated member 320 and configured to enclose the second zone 312b between the first barrier 316a and the third barrier 316c.

In the embodiments of FIGS. 3-5 the barriers 316 are radially disposed about the elongated member 320, such that the zones (e.g., first zone 312a and the second zone 312b) are axially spaced along the elongated member 320. Alternatively, barrier(s) 316 can be disposed axially along a length L of the elongated member 320, such that the first zone 312a and the second zone 312b are radially spaced about the elongated member, or both. For example, FIG. 6A is a cross section end view of a surface coating unit 300 within a tool 202/well tool 202A according to some aspects, and FIG. 6B is a cross section end view of another surface coating unit 300 within a tool 202/well tool 202A according to some aspects.

Figure 6A:
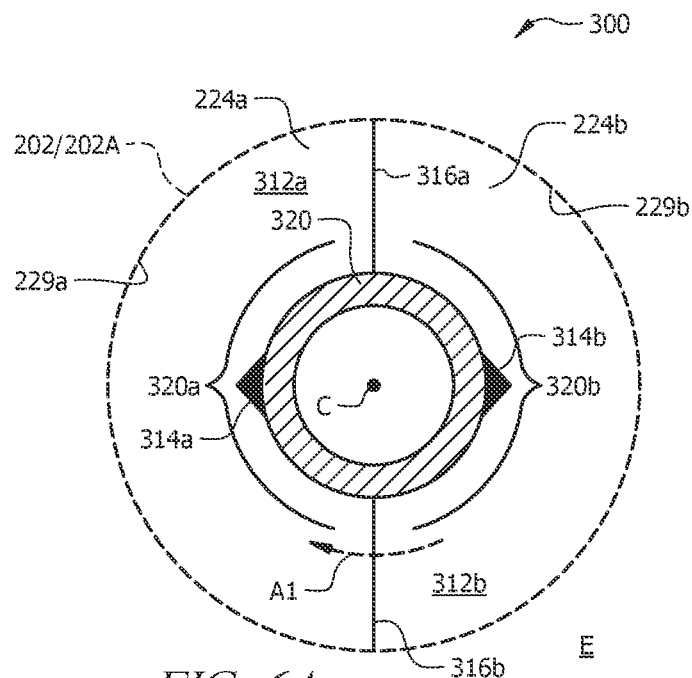
FIG. 6A is a cross section end view of a surface coating unit within a tool (e.g., a well tool) according to some aspects.

In FIG. 6A, coating unit 300 comprises a first barrier 316a and a second barrier 316b disposed axially along the elongated member 320 and configured to divide the interior volume 224 into a first zone 312a and a second zone 312b, radially spaced a distance apart (for example, without limitation, about 180 degrees apart around the circumference of elongated member 320). The first barrier 316a and the second barrier 316b further divide the elongated member 320 into a first portion 320a thereof corresponding with the first zone 312a and a second portion 320b thereof corresponding with the second zone 312b. Coating unit 300 can further comprise a first outlet or port 314a disposed within the first portion 320a of the elongated member 320 and in fluid communication with the at least one fluid flow path 302 of the elongated member 320, the first outlet or port 314a configured to introduce one or more of the reactant gases, the plasma, or both to the first zone 312a, such that upon reaction of the one or more reactant gases, optionally in the presence of the plasma, a coating is formed on all or a portion of the surface 229a of the interior volume 224a of the housing, apparatus, or tool 202/well tool 202A within the first zone 312a, and optionally a second outlet or port 314b disposed within the second portion 320b of the elongated member 320 and in fluid communication with the at least one fluid flow path 302 of the elongated member 320, the second outlet or port 314b configured to introduce one or more of the reactant gases, the plasma, or both to the second zone 312b, such that upon reaction of the one or more reactant gases, optionally in the presence of the plasma, a coating is formed on all or a portion of the surface 229b of the interior volume 224b of the housing, apparatus, or tool 202/well tool 202A within the second zone 312b. Alternatively or additionally, first portion 320a and/or second portion 320b can comprise an inlet 404, as described in more detail hereinbelow with reference to FIG. 4.

Figure 6B:
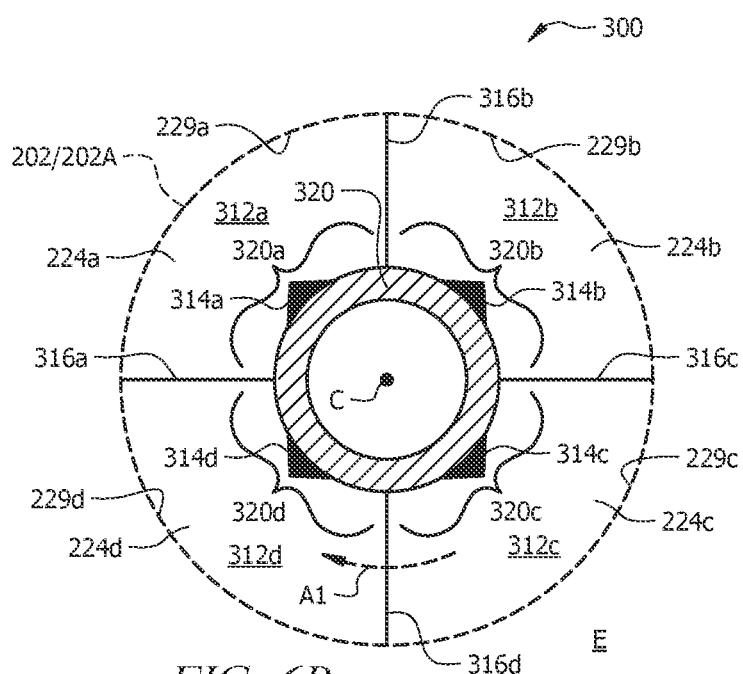
FIG. 6B is a cross section end view of a surface coating unit within a tool (e.g., a well tool) according to some aspects.

In FIG. 6B, coating unit 300 comprises a first barrier 316a, a second barrier 316b, a third barrier 316c, and a fourth barrier 316d disposed axially along length L2 of the elongated member 320 and configured to divide the interior volume 224 into a first zone 312a, a second zone 312b, a third zone 312c, and a fourth zone 312d (for example, without limitation, spaced about 90 degrees apart around the circumference of elongated member 320). The first barrier 316a, the second barrier 316b, the third barrier 316c, and the fourth barrier 316d further divide the elongated member 320 into a first portion 320a thereof corresponding with the first zone 312a, a second portion 320b thereof corresponding with the second zone 312b, a third portion 320c thereof corresponding with the third zone 312c, and a fourth portion 320d thereof corresponding with the fourth zone 312d. Coating unit 300 can further comprise a first outlet or port 314a disposed within the first portion 320a of the elongated member 320 and in fluid communication with the at least one fluid flow path or conduit 302 of the elongated member 320, the first outlet or port 314a configured to introduce one or more of the reactant gases, the plasma, or both to the first zone 312a, such that upon reaction of the one or more reactant gases, optionally in the presence of the plasma, a coating is formed on all or a portion of the surface 229a of the interior volume 224a of the housing, apparatus, or tool 202/well tool 202A within the first zone 312a; a second outlet or port 314b disposed within the second portion 320b of the elongated member 320 and in fluid communication with the at least one fluid flow path or conduit 302 of the elongated member 320, the second outlet or port 314b configured to introduce one or more of the reactant gases, the plasma, or both to the second zone 312b, such that upon reaction of the one or more reactant gases, optionally in the presence of the plasma, a coating is formed on all or a portion of the surface 229b of the interior volume 224b of the housing, apparatus, or tool 202/well tool 202A within the second zone 312b; a third outlet or port 314c disposed within the third portion 320c of the elongated member 320 and in fluid communication with the at least one fluid flow path or conduit 302 of the elongated member 320, the third outlet or port 314c configured to introduce one or more of the reactant gases, the plasma, or both to the third zone 312c, such that upon reaction of the one or more reactant gases, optionally in the presence of the plasma, a coating is formed on all or a portion of the surface 229c of the interior volume 224c of the housing, apparatus, or tool 202/well tool 202A within the third zone 312c; and/or a fourth outlet or port 314d disposed within the fourth portion 320d of the elongated member 320 and in fluid communication with the at least one fluid flow path or conduit 302 of the elongated member 320, the fourth outlet or port 314d configured to introduce one or more of the reactant gases, the plasma, or both to the fourth zone 312d, such that upon reaction of the one or more reactant gases, optionally in the presence of the plasma, a coating is formed on all or a portion of the surface 229d of the interior volume 224d of the housing, apparatus, or tool 202/well tool 202A within the fourth zone 312b. Alternatively or additionally, one or more of first portion 320a, second portion 320b, third portion 320c, or fourth portion 320d can comprise an inlet 404, as described in more detail hereinbelow with reference to FIG. 4.

A surface coating system or device 200/well tool coating system or device 200A for coating a surface 229 of an interior volume 224 disposed within a housing, apparatus, or tool 202/well tool 202A, wherein the interior volume has an inlet 205 (FIG. 1A/1B) extending through the housing, apparatus, or tool 202/well tool 202A such that the interior volume 224 is accessible from an exterior E of the housing, apparatus, or tool 202/well tool 202A via the inlet 205, can thus comprise a coating unit 300 as described with reference to the embodiments of FIG. 6A and FIG. 6B, comprising elongated member 320 having a first end 321a and a second end 321b (FIG. 1A/1B) and at least one fluid flow path 302 extending from the first end 321a to the second end 321b, wherein the elongated member 320 is fluidically coupled to at least one delivery line 228 proximate the first end 321a of the elongated member 320 and wherein the elongated member 320 is configured for placement in the interior volume 224 via the inlet 205 of interior volume 224; along with a plurality of reactant gas sources 220 comprising reactant gases for one or more surface coating processes and fluidically coupled to the at least one delivery line 228; optionally, a plasma generator 210 configured to generate a plasma and fluidically coupled to the at least one delivery line 228; and optionally a pump 214 fluidically coupled to a first end 227a of a vacuum line 227, wherein a second end 227b of the vacuum line 227 is fluidically coupled to the elongated member 320 proximate the second end 321b of the elongated member 320 (or alternatively, proximate the first end 321a of the elongated member), wherein the pump 214 is configured to create a vacuum in the vacuum line 227, said vacuum effective to evacuate a residual gas from one or more zones (e.g., a first zone 312a, a second zone 312b, a third zone 312c, and/or a fourth zone 312d), the at least one fluid flow path 302 of the elongated member 320, or combinations thereof. The surface coating system or device 200/well tool coating system or device 200A can further comprise an actuator 223 configured to rotate (e.g., about arrow A1) and/or translate (e.g., about arrow A2) the elongated member 320 relative to the housing, apparatus, or tool 202/well tool 202A and/or an actuator 223 configured to rotate (e.g., about arrow A1) and/or translate (e.g., about arrow A2) the housing, apparatus, or tool 202/well tool 202A relative to the elongated member 320.

Although described in FIG. 3 to FIG. 5, and FIG. 6A as comprising two zones 312 and one, two, or three barriers 316, and in FIG. 6B as comprising four zones 312 and four barriers 316, a coating unit 300 of this disclosure can comprise any number of barriers 316 operable to divide the interior volume 224 into any number of zones 312. For example, a coating unit 300 comprising barriers 316 disposed radially around elongated member 320 to provide axially spaced zones 312, such as described with reference to FIG. 3 to FIG. 5, can comprise, for example, from one to ten barriers 316 configured to divide interior volume 224 into from, for example, two to eleven zones 312, or more. By way of further example, a coating unit 300 comprising barriers 316 disposed axially along a length of elongated member 320 to provide radially spaced zones 312, such as described with reference to FIG. 6A and FIG. 6B, can comprise, for example, from two to ten barriers 316 configured to divide interior volume 224 into from, for example, two to ten zones 312, or more.

In some examples, the barriers 316 are flexible. This flexibility can serve to maintain the elongated member 320 substantially centered along the central axis C, as the coating unit 300 moves within (e.g., through an interior volume) the tool 202/well tool 202A and can encounter changes in the inner diameter D of the tool 202/well tool 202A. For example, FIG. 4 depicts an elongated member 320 with outlets 314 including first outlet 314a and second outlet 314b and a barrier 316 (e.g., first or sole barrier 316) defining two zones 312 (e.g., first zone 312a and second zone 312b) of different lengths. The barrier 316 includes two sets of flexible bristles 402 including first set of bristles 402a and second set of bristles 402b. Each set of flexible bristles 402 can have uniformly shaped bristles or bristles of varying sizes and shapes. The flexible bristles 402 can be sized to center the elongated member 320 along the central axis C of tool 202/well tool 202A (FIG. 3). The flexible bristles of first set of flexible bristles 402a and second set of flexible bristles 402b can deform in shape to maintain the coating unit 300 substantially centered within the tool 202/well tool 202, as the coating unit 300 translates and/or rotates within tool 202/well tool 202A and possibly encounters changes 408 in the inner diameter D of the well tool 202A (e.g., a change in inner diameter ΔD equal to D1-D2 from first inner diameter D1 to second inner diameter D2).

In some examples, the elongated member 320 includes one or more inlets 404 within the zones 312 or within a barrier 316. For example, coating unit 300 includes three inlets 404, including first inlet 404a, second inlet 404b, and third inlet 404c. The inlets 404 can be coupled to one or more pumps 214 via one or more pipes or tubing, such as pipe 406 (e.g., vacuum line 227). The one or more pumps 214 can direct fluid flow out of the tool 202/well tool 202A via the inlets 404. For example, the second outlet or port 314b can supply a reactant gas into the second zone 312b during a step of a surface coating process. Once the step is complete, the one or more pumps 214 can suction the reactant gas out of the second zone 312b via the second inlet 404b to purge the reactant gas from the second zone 312b prior to a subsequent step of the surface coating process. As another example, the first outlet or port 314a can supply a reactant gas into the first zone 312a during a step of a surface coating process. Once the step is complete, the surface coating unit 300 can be translated to the left along central axis C, such that that the third inlet 404c is positioned within an area previously forming part of zone 312a (before the translation). The pumps 214 can then suction the reactant gas from that area via the third inlet 404c. This can prevent any reactant gas still lingering in that area from mixing with another reactant gas associated with second zone 312b, as the coating unit translates through the tool 202/well tool 202A.

FIG. 5 is a cross-sectional side view of an example of coating layers deposited inside the tool 202/well tool 202A by the surface coating unit 300 according to some aspects. The coating unit 300 can deposit the coating layers by performing a multi-part surface coating process.

In some examples, a first part of the surface coating process can involve supplying a first reactant gas R1 to first zone 312a via the first outlet or port 314a and a second reactant gas R2 to second zone 312b via second outlet or port 314b, thereby forming different types of base layers 505 in the first zone 312a and the second zone 312b. Next, the surface coating unit 300 can be translated (e.g., to the left) to position the second outlet or port 314b within the first zone 312a. Once the second outlet or port 314b is positioned in the first zone 312a, the surface coating unit 300 can perform a second part of the surface coating process by supplying the second reactant gas R2 to first zone 312a via the second outlet or port 314b, thereby forming an additional coating layer or "another layer" 506 on top of the base layer 505 in the first zone 312a. Next, the surface coating unit 300 can be translated in the opposite direction (e.g., to the right) to position the first outlet or port 314a within the second zone 312b. Once the first outlet or port 314a is positioned in the second zone 312b, the surface coating unit 300 can perform a third part of the surface coating process by supplying the first reactant gas R1 to second zone 312b via the first outlet or port 314a, thereby forming an additional coating layer 506 on top of the base layer 505 in second zone 312b.

Other ways of implementing a surface coating process are also possible. For example, the surface coating unit 300 can perform a first part of the surface coating process by supplying a first reactant gas R1 to first zone 312a via the first outlet or port 314a and a second reactant gas R2 to second zone 312b via second outlet or port 314b, thereby forming different types of base layers 505 within the first zone 312a and the second zone 312b. The base layers 505 can serve to improve bonding with coating layers 506 deposited during subsequent parts of the surface coating process. Next, the surface coating system 200/well tool coating system 200A can operate a fluid delivery system 208 to switch the reactant gases supplied to the first outlet or port 314a and the second outlet or port 312b. Once these are switched, the surface coating unit 300 can perform a second part of the surface coating process involving supplying the second reactant gas R2 to first zone 312a via the first outlet or port 314a and the first reactant gas R1 to second zone 312b via second outlet or port 314b, thereby forming additional coating layers 506 on top of the base layers 505 within the first zones 312a and the second zone 312b. Other examples can involve any number and combination of coatings deposited using any number and combination of surface coating processes.

A cover 504 may be positioned over part 502 of the interior surface 229 of the tool 202/well tool 202A, in some examples. This can prevent a surface coating process from being applied to the part 502 and/or prevent damage to the part 502. In FIG. 5, the cover 308 is a metal plate positioned overtop of a ridge in order to protect the ridge from damage (e.g., as the coating unit 300 moves within (e.g., through) the tool 202/well tool 202A). Cover 308 can alternatively be positioned over other types of parts, such as, without limitation, grooves, collets, ports, sensors, latches, or threads inside the tool 202/well tool 202A.

The coating formed on all or the portion of the surface 229 of the interior volume 224 of the housing, apparatus, or tool 202/well tool 202A within a zone can be different from the coating formed on all or the portion of the surface 229 of the interior volume 224 of the housing, apparatus, or tool 202/well tool 202A within another zone. The coating formed on all or the portion of the surface 229 of the interior volume 224 of the housing, apparatus, or tool 202/well tool 202A within the another zone can have a different thickness and/or composition from a thickness and/or composition of the coating formed on all or the portion of the surface 229 of the interior volume 224 of the housing, apparatus, or tool 202/well tool 202A within the zone. For example, the coating formed on all or the portion 229a of the surface 229 of the interior volume 224a of the housing, apparatus, or tool 202/well tool 202A within the first zone 312a can be different from the coating formed on all or the portion 229b of the surface 229 of the interior volume 224b of the housing, apparatus, or tool 202/well tool 202A within the second zone 312b. Similarly, the coating formed on all or the portion 229b/229c of the surface 229 of the interior volume 224b/224c of the housing, apparatus, or tool 202/well tool 202A within the second/third zone 312b/312c can have a different thickness and/or composition from a thickness and/or composition of the coating formed on all or the portion 229a of the surface 229 of the interior volume 224a of the housing, apparatus, or tool 202/well tool 202A within the fourth/third zone 312d/312c, the first zone 312a, and/or the second zone 312b.

As noted hereinabove, a housing, apparatus, or tool 202 coated via the surface coating system or device 200 of this disclosure can comprise any apparatus, tool, or housing 202 for which a coating on an interior surface 229 thereof is desired. For example, and without limitation, the housing, apparatus, or tool 202 can comprise a furnace tube, an aircraft component (e.g., a wing, a fuselage), a component of a water supply/treatment system; a component of a vehicle fuel system; a well tool 202A; a heat exchanger or component thereof such as a shell or plurality of tubes; a pump or component thereof such as a suction or discharge chamber; a reactor or component thereof such as a vessel, manifold, catalyst bed, injector, feed and/or discharge conduit; a distillation column or component thereof such as valves or trays; a condenser or component thereof such as a housing or condenser tubes; a reboiler or component thereof such as a housing or heating tubes; an interior volume of a storage vessel; an interior volume of a transportation vessel (e.g., a fluid transport trailer pulled by a semi truck); or another housing, apparatus, or tool 202.

In some embodiments, housing, apparatus, or tool 202 comprises a well tool 202A, and the surface coating system or device 200 is referred to herein as a well tool coating system or device 200A. In such embodiments, the housing or tool 202 comprises the well tool 202A. For example and without limitation, the well tool 202A can comprise a logging tool or a wireline tool. For example and without limitations, the well tool 202A can be a drilling tool, such as, without limitation, a logging while drilling (LWD) tool, a measurements while drilling (MWD) tool, or a sampling while drilling (SWD) tool. In some such embodiments, the interior volume or region 224 of the well tool 202A comprises a fluid flow path (or "flow passage") configured for flow of a formation fluid from an exterior E of the well tool 202A through an interior (e.g., interior flow volume 224) of the well tool 202A.

Figure 7:
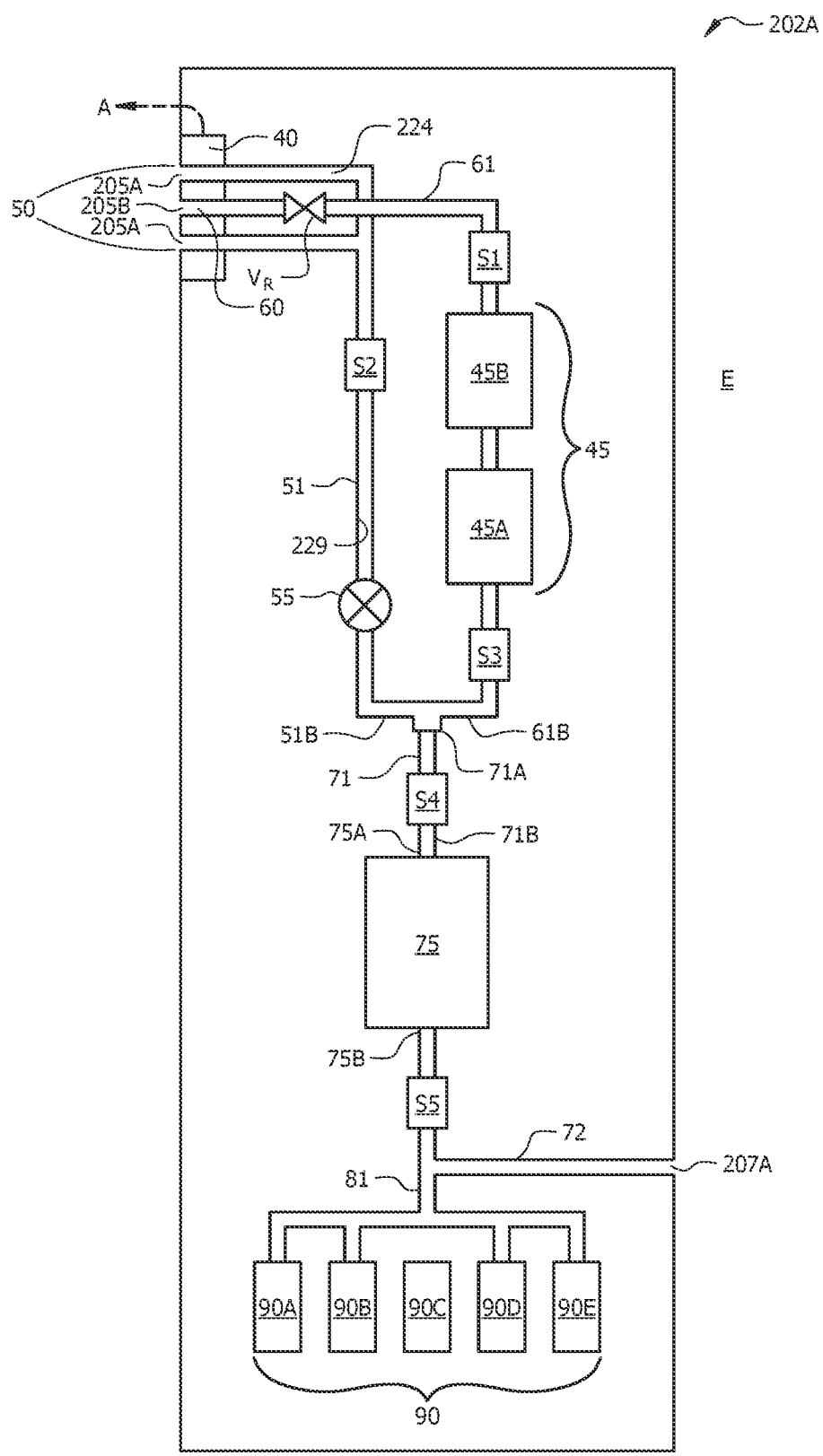
FIG. 7 is a schematic diagram of an example of a well tool that can be coated via the surface coating system according to some aspects.

In embodiments, a well tool 202A having an interior surface 229 coated via the well tool coating system or device 200A of this disclosure is a sampling tool, such as a focused sampling tool. FIG. 7 is a schematic diagram of an exemplary focused sampling well tool 202A that can be coated via the well tool coating system or device 200A according to some aspects. Well tool 202A is a focused sampling well tool operable to take one or more fluid samples having a composition representative of a virgin formation fluid in formation 104 (FIG. 2) in one or more sample chambers 90 (with five sample chambers, including first sample chamber 90A, second sample chamber 90B, third sample chamber 90C, fourth sample chamber 90D, and fifth sample chamber 90E depicted in the embodiment of FIG. 7) from within the formation 104 (FIG. 2). A well tool 202A can comprise a sample line 61; a guard line 51; a common line 71; a pump 75; a discard line 72; a sampling line 81; the one or more sample chambers 90; one or more fluid ID sensors S positioned on the guard line, the sample line, the common line, or a combination thereof (with first fluid ID sensor S1 and third fluid ID sensor S3 depicted on sample line 61, second fluid ID sensor S2 depicted on guard line 51, fourth fluid ID sensor S4 depicted on common line 71, and fifth fluid ID sensor S5 depicted on pump outlet line 76); and a flow restrictor 55.

Sample line 61 has a sample line inlet 205B and a sample line outlet 61B. Guard line 51 has a guard line inlet 205A and a guard line outlet 51B. As depicted in the embodiment of FIG. 7, a focused sampling well tool 202A of this disclosure can comprise one or a plurality of lines that extend from guard line inlets 205A thereof and merge to form a single guard line 51 toward guard line outlet 51B. This configuration of guard line is intended to be included in the term "guard line(s) 51". In embodiments, the guard line(s) 51 is configured for a higher fluid flow rate $Q_G$ than a fluid flow rate $Q_S$ of the sample line 61. Common line 71 has a common line inlet 71A and a common line outlet 71B, and is fluidly connected with the sample line outlet 61B and the guard line outlet 51B, for example at a tee or Y junction. Pump 75 has a suction side inlet 75A and a discharge side outlet 75B. Suction side inlet 75A of pump 75 is fluidly connected with common line outlet 71B and discharge side outlet 75B of pump 75 is fluidly connected with discard line 72 and sampling line 81, for example via a tee or Y junction. Discard line 72 has a discard line outlet 207A. In embodiments, focused sampling tool 202A of this disclosure comprises a single pump 75, whereby fluid is pulled into the well tool 202A via a common pump (e.g., single pump 75) and a common suction line (e.g., common line 71). Sampling line 81 is fluidly connected with the one or more sample chambers 90.

Flow restrictor 55 is operable to prevent flow of fluid from guard line 51 to common line 71 in a first (e.g., closed) configuration and allow flow of fluid from the guard line 51 to the common line 71 in a second (e.g., open) configuration. In embodiments, flow restrictor 55 is a shutoff valve. In embodiments, sample line 61 has a flow restrictor thereupon, such as restrictor valve $V_R$, that is operable as a shutoff valve that can be actuated to prevent fluid flow through sample line 61. In some embodiments, a separate restrictor 55 may not be present. Flow restrictor 55 can be a check valve. Restrictor 55 can be positioned on guard line 51 upstream of guard line outlet 51B. Sample line 61 can comprise a check valve upstream of sample line outlet 61B, in embodiments.

A focused sampling well tool 202A of this disclosure can further comprise a probe 40 that can extend from well tool 202A during formation sampling (as indicated by arrow A in FIG. 7) and define a sample zone 60 fluidly connected with the sample line inlet 205B of the sample line 61, a guard zone 50 fluidly connected with the guard line inlets 205A of the guard line 51, or both a sample zone 60 fluidly connected with the sample line inlet 205B of the sample line 61 and a guard zone 50 fluidly connected with the guard line inlet 205A of the guard line 51. For example, focused sampling well tool 202A of the embodiment of FIG. 7 further comprises probe 40 defining sample zone 60 fluidly connected with the sample line inlet 205B of the sample line 61, and guard zone 50 fluidly connected with the guard line inlets 205A of the guard line 51. The guard zone 50 and the sample zone 60 are in fluid communication with the subsurface formation 104 (FIG. 2), during operation of the focused sampling well tool 202A.

The comparative flow rate $Q_G$ in the guard line(s) 51 from guard zone(s) 50 and flow rate $Q_S$ in the sample line 61 from sample zone 60 can be represented by a ratio of flow rates $Q_G/Q_S$. (The flow rate into the sample line 61 from the sample zone is represented by $Q_S$, and is also referred to herein as the flow rate in the sample zone, and the flow rate into the guard line(s) from the guard zone(s) 50 is represented by $Q_G$, and is also referred to herein as the flow rate in the guard zone(s).) The flow rate $Q_S$ in the sample line 61 from sample zone 60 may be selectively increased and/or the flow rate $Q_G$ in the guard line(s) 51 from guard zone(s) 50 may be decreased to allow more fluid to be drawn into the sample zone 60. Alternatively, the flow rate $Q_S$ in the sample line 61 from sample zone 60 may be selectively decreased and/or the flow rate $Q_G$ in the guard line(s) 51 from guard zone(s) 50 may be increased to allow less fluid to be drawn into the sample line 61 via sample zone 60. As a focused sampling well tool 202A can comprise a single pump 75, a restrictor valve 55 and/or diameter of sample line 61 and/or guard line(s) 51 can be selected to provide the desired ratio $Q_G/Q_S$ of fluid flow rate in the guard zone(s) 50 to the fluid flow rate in the sample zone 60. In alternative configurations, focused sampling tool 202A can comprise two or more pumps, for example a first pump coupled to sample line 61 and one or more additional pumps coupled to guard line(s) 51, whereby the two or more pumps can be operated independently to provide to provide the desired ratio $Q_G/Q_S$ of fluid flow rate in the guard zone(s) 50 to the fluid flow rate in the sample zone 60.

A focused sampling well tool 202A can further comprise one or more dead volumes 45 in fluid communication with the sample line 61. The one or more dead volumes 45 can be online or offline dead volumes, meaning fluid in sample line 61 flows through the one or more dead volumes ("online") or does not flow through the one or more dead volumes ("offline") during a pre-sampling time period. As depicted in FIG. 7, the one or more dead volumes 45 can include a first dead volume 45A and a second dead volume 45B in series along the sample line 61. The one or more dead volumes 45 provide a total dead volume $V_{TOT}$. In embodiments, the total dead volume $V_{TOT}$ is greater than or equal to a total sample volume of the one or more sample chambers 90.

Focused sampling well tool 202A can be operated to take one or more fluid samples (in the one or more sample chambers 90) from formation 104 (FIG. 2), wherein the one or more fluid samples have a composition approximating that of a virgin formation fluid in formation 104.

Well tool coating system or device 200A can be utilized to coat an interior surface 229 extending from guard line inlet 205A and guard line 50 and/or from sample line inlet 205B and sample line 61 to discard line outlet 72. For example, well tool coating system 200A can be utilized to coat an interior surface 229 within an interior volume 224 extending from guard line inlet 205A and guard line 50 and/or from sample line inlet 205B and sample line 61; optionally through the one or more dead volumes 45 (e.g., first dead volume 45A and second dead volume 45B); through common line 71, pump 75, optionally sampling line 81, and discard line 72; to discard line outlet 207A. Elongated member 320 can be positioned within a portion of the interior volume 224 for coating the interior surface 229 thereof. As described hereinabove, during the forming of the coating, elongated member 320 can be translated and/or rotated relative to well tool 202A and/or well tool 202A translated and/or rotated relative to elongated member 320.

Figure 8:
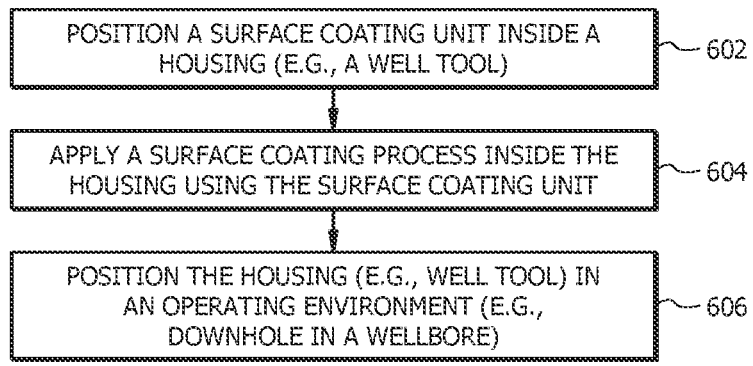
FIG. 8 is a flow chart of an example of a process for depositing coatings within tools (e.g., well tools) according to some aspects.

In some examples, one or more coatings can be applied within a housing, apparatus, or tool 202/well tool 202A in accordance with the process shown in FIG. 8. Other examples can include more steps, fewer steps, different steps, or a different order of the steps than is shown in FIG. 8. The steps of FIG. 8 are discussed below with reference to the components discussed above in relation to FIG. 1A, FIG. 1B, FIG. 3 to FIG. 5, and FIG. 6A and FIG. 6B.

In block 602, a surface coating unit 300 is positioned inside a housing, apparatus, or tool 202/well tool 202A. This may involve a controller 206 operating an actuator 223 to position the coating unit 300 into the housing, apparatus, or tool 202/well tool 202A (e.g., by translating the housing, apparatus, or tool 202/well tool 202A and/or the coating unit 300 along, for example, central axis C). Alternatively, this may involve an operator positioning the coating unit 300 inside the housing, apparatus, or tool 202/well tool 202A (e.g., by translating the housing, apparatus, or tool 202/well tool 202A and/or the coating unit 300 along, for example, central axis C).

After positioning the coating unit 300 inside the housing, apparatus, or tool 202/well tool 202A, heat or pressure can be applied to the housing, apparatus, or tool 202/well tool 202A to create ambient conditions inside the housing, apparatus, or tool 202/well tool 202A that are conducive to one or more surface coating processes, such as, without limitation, ALD and/or CVD.

In block 604, a surface coating process is applied to an interior surface 229 of an interior region 224 of the housing, apparatus, or tool 202/well tool 202A using the coating unit 300. In some examples, this step can be implemented using any of the processes discussed herein. For example, and without limitation, the coating applied at block 604 of FIG. 8 can be carried out in accordance with the coating method described with reference to FIG. 9 and blocks 702, 704, 706, and 708.

In block 606, the housing, apparatus, or tool/well tool 202A is positioned in an operating environment (e.g., within a wellbore 102 (FIG. 2)). For example, when housing, apparatus, or tool 202 comprises a well tool 202A, block 606 can comprise positioning the well tool 202A in the wellbore 102 (FIG. 2). For example, the well tool 202A can be positioned downhole using any suitable type of conveyance, such as a drillpipe, wireline, slickline, or coiled tubing. The housing, apparatus, or tool 202/well tool 202A can then be utilized to perform one or more operations. For example, the well tool 202A can then be used to perform one or more downhole operations, such as, without limitation, formation fluid sampling.

Figure 9:
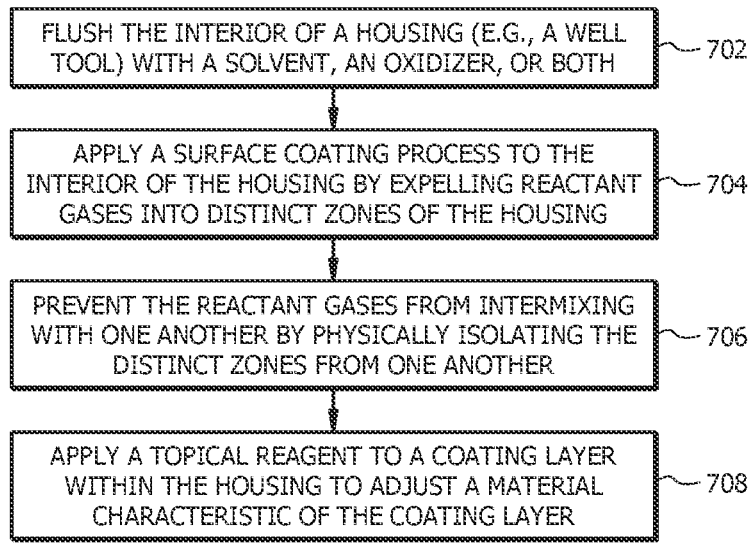
FIG. 9 is a flow chart of an example of a process for depositing coatings within tools (e.g., well tools) according to some aspects.

In some examples, one or more coatings can be applied within a housing, apparatus, or tool 202/well tool 202A in accordance with the process shown in FIG. 9. Other examples can include more steps, fewer steps, different steps, or a different order of the steps than is shown in FIG. 9. The steps of FIG. 9 are discussed below with reference to the components discussed above in relation to FIG. 1A, FIG. 1B, FIG. 3 to FIG. 5, and FIG. 6A and FIG. 6B.

In block 702, a surface coating unit 300 flushes the interior region 224 of the housing, apparatus, or tool 202/well tool 202A with a solvent S, an oxidizer O, or both. For example, the controller 206 can operate the fluid delivery system 208 to provide sequential or simultaneous flow of the solvent S, the oxidizer O, or both into one or more of the zones 312 of the housing, apparatus, or tool 202/well tool 202A via the coating unit 300. This may help to prepare the one or more of the zones 312 for one or more surface coating processes.

In block 704, the coating unit 300 applies a surface coating process to an interior surface 229 of an interior region or volume 224 of the housing, apparatus, or tool 202/well tool 202A by expelling reactant gases via outlets or ports 314 (e.g., first outlet or port 314a, second outlet or port 314b, and so on) into distinct zones 312 (e.g., into first zone 312a, second zone 312b, and so on) inside the housing, apparatus, or tool 202/well tool 202A. For example, the controller 206 can operate the fluid delivery system 208 and the actuator(s) 223 to provide sequential or simultaneous flow of reactive gases through the coating unit 300 and into the zones 312 in accordance with one or more types of surface coating processes such as ALD and/or CVD. In embodiments, one or more of the reactant gases can be provided as a plasma produced in plasma generator 210.

In block 706, the coating unit 300 prevents the reactant gases from intermixing with one another by physically isolating the distinct zones 312 from one another (e.g., isolating first zone 312a from second zone 312b, and so on). The coating unit 300 can prevent the reactant gases from intermixing using one or more barriers (e.g., first barrier 316a, second barrier 316b, third barrier 316c, and/or fourth barrier 316d, in the embodiments of FIGS. 3-6B. In some examples, each barrier 316 can be a fluidic (e.g., ferrofluidic) or gaseous barrier generated by expelling a gas (e.g., a buffer gas) via an outlet or port 314 of the coating unit 300. The gaseous barrier can physically isolate the zones 312 from one another. In other examples, each barrier 316 can be a solid barrier coupled to the coating unit 300 and movable in unison with the coating unit 300. In other examples, each barrier 316 can be independently selected from the types of barriers described herein, coupled to the coating unit 300 in a manner effective to isolate the zones 312 from one another, and movable in unison with the coating unit 300.

In block 708, the coating unit 300 applies a topical reagent TR to a coating layer within the housing, apparatus, or tool 202/well tool 202A to adjust a material characteristic of the coating layer. The coating layer to which the TR is applied can be an uppermost coating layer in a zone 312 of the housing, apparatus, or tool 202/well tool 202A. The uppermost or "topmost" coating layer is a one of the one or more coating layers farthest from the uncoated interior surface 229 of the interior volume 224 of the housing, apparatus, or tool 202/well tool 202A. For example, the controller 206 can operate the fluid delivery system 208 to provide sequential or simultaneous flow of the topical reagent TR through the coating unit 300 and into a zone 312, in order to adjust a material characteristic of a coating layer in that zone 312. In some processes, applying a topical reagent TR at block 708 may be optional or not required where a material characteristic of an uppermost coating layer does not need adjustment. In some processes, applying a topical reagent TR at block 708 may be performed between on or more layers other than the uppermost coating layer. For example a topical reagent may be applied after an ALD coating layer is applied and before a CVD coating layer is applied; a topical reagent may be applied after a CVD coating layer is applied and before an ALD coating layer is applied, or combinations thereof.

In embodiments such as described with reference to FIG. 9, one or more of the reactant gases can be provided as a plasma produced in plasma generator 210. Additionally or alternatively, in embodiments, ALE can be utilized as detailed hereinabove to pretreat a surface 229 to be coated prior to applying the surface coating at 704 (e.g., prior to applying an ALD and/or CVD base layer 505) and/or subsequent to a step 704 (e.g., subsequent to deposition of a base layer 505 and/or another layer 506).

Some or all of the above steps can be performed at a worksite or jobsite (e.g., for example without limitation, a wellsite 100 (FIG. 2)). For example, the surface coating system or device 200 can be a well tool coating system or device 200A, and can be positioned at the wellsite 100 for performing steps 702-708 after delivery of the well tool 202A to the wellsite 100 and prior to positioning the well tool 202A downhole. Some or all of the above steps can also be repeated, for example, in instances where there are multiple enclosed volumes inside the well tool 202A. Some or all of the above steps can also be repeated, for example, in instances where a well tool 202A is recovered from being deployed downhole, and while downhole an interior surface of the well tool 202A was exposed to formation fluid, wherein the process as depicted in FIG. 9 can be used to coat and/or re-coat all or a portion of the interior surface of the well tool 202A that was exposed to the formation fluid.

In aspects, a method of coating a surface 229 of an interior volume 224 of a housing, apparatus, or tool 202/well tool 202A, wherein the interior volume 224 has an inlet 205, comprises: partitioning the interior volume 224 of the housing, apparatus, or tool 202/well tool 202A into a first zone 312a and a second zone 312b, wherein the first zone 312a is isolated from fluid communication with the second zone 312b; introducing one or more reactant gases, plasma, or both to the first zone 312a and the second zone 312b; forming one or more coating layers on all or a portion of the surface 229a of the interior volume 224a of the housing, apparatus, or tool 202/well tool 202A within the first zone 312a and the surface 229b of the interior volume 224b of the housing, apparatus, or tool 202/well tool 202A within the second zone 312b via reaction of the reactant gases, optionally in the presence of the plasma; and optionally, evacuating (e.g., vacuuming) an unreacted portion of the one or more reactant gases and/or byproducts from the first zone 312a, the second zone 312b, or both.

In aspects, a method of coating a surface 229 of an interior volume 224 of a housing, apparatus, or tool 202/well tool 202A, wherein the interior volume 224 has an inlet 205, comprises: positioning a coating device 300 as described herein and the housing, apparatus, or tool 202/well tool 202A proximate each other; placing the elongated member 320 into the interior volume 224 of the housing, apparatus, or tool 202/well tool 202A via the inlet 205, whereby the first barrier 316a divides the interior volume 224 into the first zone 312a and the second zone 312b; introducing one or more reactant gases, plasma, or both to the first zone 312a and the second zone 312b via at least one delivery line 228, at least one fluid flow path 302 (e.g., 302a and 302b), and the first port 314a and the second port 314b, respectively; forming one or more coating layers on all or a portion of the surface 229a and 229b of the interior volume 224a and 224b of the housing, apparatus, or tool 202/well tool 202A within the first zone 312a and the second zone 312b via reaction of the one or more reactant gases, optionally in the presence of the plasma; and optionally, activating the pump 214 to evacuate (e.g., vacuum) an unreacted portion of the one or more reactant gases from the first zone 312a, the second zone 312b, or both.

The reaction can comprise a chemical vapor deposition (CVD) reaction, an atomic layer deposition (ALD) reaction, or both, such that the one or more coating layers respectively comprise an ALD layer, a CVD layer, or both. Additionally or alternatively, the reaction can comprise atomic layer etching (ALE).

For example, in embodiments, the method can comprise: forming an ALD layer by: (i) introducing a first reactant gas R1 into a reaction zone 312 selected from the first zone 312a and the second zone 312b, such that at least a portion of the first reactant gas R1 chemically bonds with the surface 229 of the interior volume 224 within the reaction zone 312, to form a reactive layer; (ii) removing unreacted first reactant gas R1 and/or gaseous byproducts from the reaction zone 312; (iii) introducing a second reactant gas R2 into the reaction zone 312, such that at least some of the second reactant gas R2 bonds with the reactive layer to form the ALD layer; and (iv) optionally removing unreacted second reactant gas R2 and/or gaseous byproducts from the reaction zone 312. Some combination of (i) through (iv) may be utilized to form the ALD layer within reaction zone 312. For example, not all of (i) to (iv) need be utilized during the forming of the ALD layer (e.g., removing unreacted second reactant gas R2 and/or gaseous byproducts from the zone 312 at (ii) and/or (iv) may be absent, due to the spatial sequencing provided by barriers 316 and/or continuous buffering between reaction zones 312).

For example and with reference now to FIG. 1A and FIG. 1B, forming an ALD layer can comprise (i) introducing a first reactant gas R1 from source 220 of reactant gas R1 into the reaction zone 312, such that at least a portion of the first reactant gas R1 chemically bonds with the surface 229 therein to form a reactive layer. Controller 206 can be utilized to control the formation of the reactant layer. Forming the ALD layer can further comprise (ii) removing unreacted first reactant gas R1 and/or gaseous byproducts from the reaction zone 312. Removing unreacted first reactant gas R1 and/or gaseous byproducts from the reaction zone 312 can comprise pumping via pump 214 unreacted first reactant gas R1 and/or gaseous byproducts out of reaction zone 312 via vacuum line 227 and optionally trap 212, and/or introducing buffer B from a buffer source 220 into reaction zone 312. Controller 206 can be utilized to control the removal of unreacted first reactant gas R1 and/or gaseous byproducts from the reaction zone 312. Forming the ALD layer can further comprise (iii) introducing a second reactant gas R2 from a source 220 of the second reactant gas R2 into the reaction zone 312, such that at least some of the second reactant gas R2 bonds with the reactive layer to form an ALD layer. Controller 206 can be utilized to control the introducing of the second reactant gas R2 from the source 220 of the second reactant gas R2 into the reaction zone 312. Forming the ALD layer can further comprise (iv) removing unreacted second reactant gas R2 and/or gaseous byproducts from the reaction zone 312. One or more of steps (i) through (iv) of forming an ALD layer can be repeated to obtain a desired number of ALD coatings and a desired thickness of each coating within the ALD layer. During one or more of steps (i) through (iv) of forming the ALD layer, heating unit 218 can be operated to provide a desired temperature within reaction zone 312. Controller 206 can be utilized to control the temperature provided by heating unit 218. One or both of the first reactant gas R1 or the second reactant gas R2 can be provided from a source 220 thereof via a plasma generator 210. As noted hereinabove, utilizing a plasma generator 210 to provide one or both of the first reactant gas R1 and/or the second reactant gas R2 can enable surface coating to occur under a wider range of ambient conditions (e.g., temperatures and pressures) inside the reaction zone 312 as compared to a thermal approach using a heat source such as heating unit 218, and/or enable a wider range of material properties to be realized as compared to a thermal approach using a heat source such as heating unit 218.

In embodiments, the forming of the ALD layer or layers produced as detailed hereinabove is performed prior to and/or subsequent to deposition of a CVD layer within the reaction zone 312. That is, an ALD layer formed by repetition of a combination of one or more steps (i) through (iv) can be a base layer 505 (e.g., can be a layer in direct contact with interior surface 229) and/or can be another layer 506 deposited subsequent deposition of a disparate base layer 505 or subsequent deposition of an underlying layer or "underlayer" (e.g., a layer 506 deposited prior to the ALD layer, but not in direct contact with interior surface 229). In embodiments, ALD can be utilized to deposit an ALD coating in applications in which no CVD coating is applied. Controller 206 can be utilized to precisely control the pulsing and timing (e.g., sequence and/or residence time of each gas in reaction zone 312, and/or translation and/or rotation of housing, apparatus, or tool 202/well tool 202A and/or elongated member 320) of gases in each of the one or more steps (i) through (iv).

In embodiments the method can comprise or further comprise forming a CVD layer by: (a) introducing at least a third reactant gas R3 into a reaction zone 312 selected from the first reaction zone 312a and the second reaction zone 312b, such that the at least the third reactant gas R3 chemically reacts with the surface 229 (or with a previously applied coating surface such as base layer 505) within the reaction zone 312. In embodiments, the method comprises both forming an ALD layer and a CVD layer, wherein forming both an ALD layer and a CVD layer comprises forming an ALD layer (e.g., an ALD base layer 505 or underlayer/another layer 506) on the surface 229 within the reaction zone 312 and subsequently forming the CVD layer on the ALD layer or forming the CVD layer (e.g., a CVD base layer 505 or underlayer/another layer 506) on the surface 229 within the reaction zone 312 and subsequently forming the ALD layer on the CVD layer.

For example and with reference now to FIG. 1A and FIG. 1B, forming a CVD layer can comprise: (a) introducing at least one reactant gas into the reaction zone 312 such that it chemically reacts with a surface (e.g., interior surface 229, base layer 505, or another layer 506) inside the reaction zone. In some examples, forming the CVD layer can comprise introducing two or more reactant gases simultaneously and optionally continuously into the reaction zone 312 such that the two or more reactant gases chemically react with a surface (e.g., interior surface 229, optionally previously coated with an ALD layer and/or etched via ALE) inside the reaction zone 312. Controller 206 can be utilized to control the formation of the CVD layer. In embodiments, forming a CVD layer comprises introducing third reactant gas R3 from a gas source 220 and optionally a fourth reactant gas R4 from a gas source 220 into the reaction zone 312 via delivery line 228. Controller 206 can be utilized to control the timing and duration of introduction of the third and/or fourth (or fifth, and so on) reactant gas into the reaction zone 312 during formation of the CVD layer. Forming the CVD layer can further comprise (b) removing unreacted third reactant gas R3 and/or fourth reactant gas R4 or so on reactant gases and/or gaseous byproducts from the reaction zone, for example via one or more inlets 404 associated with the reaction zone 312. Steps (a) and (b) of forming a CVD layer can be repeated to obtain a desired number of CVD coatings and a desired thickness of each coating within the CVD layer. Some combination of (a) and/or (b) may be utilized to form the CVD layer. For example, both of (a) and (b) need not be utilized during the forming of the CVD layer (e.g., removing unreacted third reactant gas R3 and/or unreacted fourth reactant gas R4 or so on reactant gases and/or gaseous byproducts from the reaction zone 312 at (b) may be absent).

During one or more of steps (a) or (b) of forming the CVD layer, heating unit 218 can be operated to provide a desired temperature within reaction zone 312. Controller 206 can be utilized to control the temperature provided by heating unit 218. One or both of the third reactant gas R3 or the fourth reactant gas R4 (and optionally additional reactant gas(es)) can be provided from a source 220 thereof via a plasma generator 210. As noted hereinabove, utilizing a plasma generator 210 to provide one or both of the third reactant gas R3 and/or the fourth reactant gas R4 (and optionally additional reactant gas(es)) can enable surface coating to occur under a wider range of ambient conditions (e.g., temperatures and pressures) inside the reaction zone 312 as compared to a thermal approach using a heat source such as heating unit 218, and/or enable a wider range of material properties to be realized as compared to a thermal approach using a heat source such as heating unit 218.

In embodiments, the CVD layer or layers produced as detailed hereinabove is performed prior to and/or subsequent to deposition of an ALD layer. That is, a CVD layer formed by repetition of a combination of one or more steps (a) through (b) can be the base layer 505 (e.g., a layer in direct contact with interior surface 229) and/or can be another layer 506 deposited subsequent deposition of a disparate base layer 505 or subsequent deposition of an underlying layer or underlayer/another layer 506 (e.g., a layer deposited prior to deposition of this CVD layer, but not in direct contact with interior surface 229 within reaction zone 312). In embodiments, CVD can be utilized to deposit a CVD coating in applications in which no ALD coating is applied. In such cases, gas sources 220 can include third reactant gas R3 and/or fourth reactant gas R4, or so on, but reactant gas R1 and/or reactant gas R2 sources 220 may be absent. (That is, the recitation of a third reactant gas R3 should not be interpreted to require the use of first reactant gas R1 and a second reactant gas R2.) Controller 206 can be utilized to precisely control the pulsing and timing (e.g., the sequence and residence time of each gas in reaction zone 312, translation and/or rotation of housing, apparatus, or tool 202/well tool 202A and/or elongated member 320) of gases in each of the one or more steps (a) and/or (b).

Actuator 223 can be operated to translate and/or rotate elongated member 320 or housing, apparatus, or tool 202/well tool 202A relative to housing, apparatus, or tool 202/well tool 202A or elongated member 320, respectively, before, after, or between any of steps (i) to (iv) of the ALD layer forming, the steps (a) and (b) of the CVD forming (or the steps (1)-(4) of ALE or the steps of TR application as described herein) and/or between the forming of an ALD coating layer, the forming of a CVD coating layer, ALE, and/or TR. For example, in embodiments, the method can comprise introducing a first reactant gas R1 and/or plasma into the first zone 312a and a second reactant gas R2 and/or plasma into the second zone 312b, wherein the first reactant gas and/or plasma R1 and the second reactant gas and/or plasma R2 are the same or different; translating and/or rotating the elongated member 320 and/or the housing, apparatus, or tool 202/well tool 202A; and introducing a third reactant gas and/or plasma R3 into the first reaction zone 312a and/or a fourth reactant gas and/or plasma R4 into the second zone 312b to form an initial coating layer on the surface 229a of the interior volume 224a within the first zone 312a and an initial coating on the surface 229b of the interior volume 224b within the second zone 312b, wherein the initial coating layer on the surface 229a of the interior volume 224a of the housing, apparatus, or tool 202/well tool 202A within the first zone 312a is the same or different from the initial coating on the surface 229b of the interior volume 224b of the housing, apparatus, or tool 202/well tool 202A within the second zone 312b; and/or subsequent forming the one or more coating layers on the all or the portion of the surface 229a within the first zone 312a and the all or the portion of the surface 229b within the second zone 312b, translating and/or rotating the elongated member 320 within the interior volume 224 and/or the housing, apparatus, or tool 202/well tool 202A about the elongated member 320 to provide a third zone 312c and optionally a fourth zone 312d, introducing one or more reactant gases, plasma, or both to the third zone 312c and/or the fourth zone 312d, and forming one or more coating layers on all or a portion of the surface 229c of the interior volume 224c of the housing, apparatus, or tool 202/well tool 202A within the third zone 312c and/or the surface 229d of the interior volume 224d of the housing, apparatus, or tool 202/well tool 202A within the fourth zone 312d via reaction of the reactant gases, optionally in the presence of the plasma.

As noted above, the method of coating the surface 229 of the interior region or volume 224 of the housing, apparatus, or tool 202/well tool 202A can further comprise performing an atomic layer etching (ALE) process to pre-treat the surface 229 of the interior volume 224 of the housing, apparatus, or tool 202/well tool 202A within the reaction zone 312 prior to the forming of the one or more coating layers on the all or the portion of the surface 229 of the interior volume 224 of the housing, apparatus, or tool 202/well tool 202A within the reaction zone 312 and/or to reduce a thickness of at least one of the one or more coating layers. ALE can comprise (1) applying an etching gas EG to a surface in the reaction zone, such that the surface chemically reacts with and adsorbs the etching gas EG; (2) purging the etching gas EG and any gaseous byproducts from the reaction zone 312 (for example by operating pump 214 to apply a vacuum to inlets 404 via vacuum line 227); (3) applying low-energy ions to the portions of the surface that chemically reacted with the etching gas EG to etch away said portions; and (4) optionally purging byproducts from the reaction zone 312 (for example by operating pump 214 to apply a vacuum to inlets 404 via vacuum line 227). Applying the etching gas EG to the surface in the reaction zone 312, can comprise applying the etching gas EG to an uncoated surface 229 within the reaction zone 312 to enhance subsequent deposition of a base layer 505 comprising ALD or CVD or to a surface 229 within the reaction zone 312 upon which an ALD coating or a CVD coating was last applied (e.g., to an already coated surface 229 within reaction zone 312). Applying the etching gas EG to the surface can comprise actuating the fluid delivery system 208 to supply the etching gas EG from a source 220 thereof to within the reaction zone 312 via delivery line 228. Subsequent the applying of the EG, performing the ALE can comprise (2) purging the etching gas EG and any gaseous byproducts from the reaction zone 312, for example by actuating the pump 214 to apply a vacuum and/or actuating the fluid delivery system 208 to supply a buffer gas (e.g., buffer gas B from a source 220 thereof) to within the reaction zone 312. Performing the ALE further comprises (3) applying low-energy ions to the portions of the surface that chemically reacted with the etching gas EG in steps (1) and/or (2) to etch away said portions. The low-energy ions can be provided via an ion source such as ion generator 222. Performing the ALE can further comprise optionally purging the reaction zone 312 (for example by operating pump 214 to apply a vacuum to inlets 404 via vacuum line 227). The controller 206 be utilized to control the ALE. For example, the controller 206 can implement (2) and/or (4) by actuating the pump 214, actuating the fluid delivery system 208 to supply a buffer gas (e.g., buffer gas B, which can be the same or different in (2) and (4)) to within the reaction zone 312, or both. The controller 206 can implement (3) by actuating an ion generator 222, which can supply the low-energy ions to the reaction zone 312. Some or all of these steps can be repeated as many times as is required. Some combination of (1) through (4) may be utilized to perform the ALE. For example, not all of (1) to (4) may be utilized during the ALE (e.g., purging byproducts at (4) may be absent).

For example and with reference now to FIG. 1A and FIG. 1B, the method of coating the surface 229 of the interior region or volume 224 of the housing, apparatus, or tool 202/well tool 202A can comprise: performing an atomic layer etching (ALE) process to pre-treat a reaction zone selected from first zone 312a and second zone 312b prior to the forming of the one or more coating layers on the all or the portion of the surface 229 of the interior volume 224 of the housing, apparatus, or tool 202/well tool 202A within the reaction zone 312 and/or to reduce a thickness of at least one of the one or more coating layers within the reaction zone 312. That is, ALE etching can be performed on surface 229 within reaction zone 312 prior to deposition of a base layer 505 thereupon, e.g., prior to deposition of a ALD or CVD base layer 505 on uncoated interior surface 229 within the reaction zone 312. Alternatively or additionally, performing ALE etching can be effected subsequent to deposition of a CVD layer (e.g., subsequent to deposition of a CVD base layer 505 or an underlying/another CVD layer 506), subsequent to deposition of an ALD layer (e.g., subsequent to deposition of an ALD base layer 505 or an underlying/another ALD layer 506), or both subsequent to deposition of a CVD layer and subsequent to deposition of an ALD layer (with the ALD layer being deposited before or after the CVD layer).

As described hereinabove, a method of coating a surface 229 of an interior region or volume 224 of a housing, apparatus, or tool 202/well tool 202A according to this disclosure can further comprise flowing a topical reagent TR to at least one of the one or more coating layers, wherein the topical reagent TR is configured to react with the coating layer and thereby adjust a material characteristic of the coating layer. The flowing of the topical reagent TR to at least one of the one or more coating layers can comprise flowing the topical reagent TR to a topmost coating layer on the all or the portion of the surface 229 of the interior volume 224 of the housing, apparatus, or tool 202/well tool 202A within the first zone 312a and/or a topmost coating layer on the all or the portion of the surface 229 of the interior volume 224 of the housing, apparatus, or tool 202/well tool 202A within the second zone 312b, wherein the topmost coating layer is a one of the one or more coating layers farthest from the surface 229 of the interior volume 224 of the housing, apparatus, or tool 202/well tool 202A.

For example and with reference now to FIG. 1A and FIG. 1B, the method of coating the surface 229 of the interior region or volume 224 of the housing, apparatus, or tool 202/well tool 202A can comprise: flowing the topical reagent TR to at least one of the one or more coating layers can comprise flowing the TR over a deposited ALD layer, flowing the TR over a deposited CVD layer, flowing the TR into the reaction zone 312 during formation of an ALD layer (e.g., during one or more of the one or more steps (i) through (iv) of forming an ALD layer, as described hereinabove), flowing the TR into the reaction zone 312 during formation of a CVD layer (e.g., during one or more of the one or both steps (a) or (b) of forming a CVD layer, as described hereinabove), or a combination thereof.

Forming the one or more coating layers on all or a portion of the surface 229 of the interior volume 224 of the housing, apparatus, or tool 202/well tool 202A within reaction zone 312 via reaction of the reactant gases, optionally in the presence of the plasma, can further comprise actuating the housing, apparatus, or tool 202/well tool 202A to expose an additional surface in the interior volume 224 of the housing, apparatus, or tool 202/well tool 202A and coating at least a portion of the additional surface.

The forming of the one or more coating layers can be effected at a worksite (e.g., wellsite 100) at which the housing, apparatus, or tool 202/well tool 202A will subsequently be employed. For example, one or more coating layers can be formed on a well tool 202A at a wellsite 100 (FIG. 2) at which the well tool 202A has been and/or will be employed.

As noted hereinabove, the housing, apparatus, tool 202 can comprise a furnace tube, an aircraft component (e.g., a wing, a fuselage), a component of a water supply/treatment system; a component of a vehicle fuel system; a well tool 202A; a heat exchanger or component thereof such as a shell or plurality of tubes; a pump or component thereof such as a suction or discharge chamber; a reactor or component thereof such as a vessel, manifold, catalyst bed, injector, feed and/or discharge conduit; a distillation column or component thereof such as valves or trays; a condenser or component thereof such as a housing or condenser tubes; a reboiler or component thereof such as a housing or heating tubes; an interior volume of a storage vessel; an interior volume of a transportation vessel (e.g., a fluid transport trailer pulled by a semi truck); or another housing, apparatus, or tool 202. The interior volume 224 of the housing, apparatus, or tool 202/well tool 202A can comprise a fluid flow path of the tool, apparatus, or housing 202/well tool 202A. The housing, apparatus, or tool 202 can comprise, without limitation, a well tool 202A. The well tool 202A can comprise, without limitation, a logging while drilling (LWD) tool, a measurements while drilling (MWD) tool, or a sampling while drilling (SWD) tool. In such embodiments, the interior volume 224 of the well tool 202A can comprise a fluid flow path configured for flow of a formation fluid from an exterior E of the well tool 202A through an interior (e.g., interior volume 224) of the well tool 202A.

The method can further comprise, subsequent the coating, placing the housing, apparatus, or tool 202/well tool 202A in an operating environment therefor (e.g., a wellbore 102) and contacting the coated surface 229 with an operations fluid (e.g., contacting the coated surface 229 with formation fluid from the formation 104 (FIG. 2)). For example and with reference now to FIG. 7, due to the portability of the herein disclosed surface coating system 200/well tool coating system 200A, a coating can be formed on all or a portion of the interior surface 229 of the interior volume 224 of a well tool 202A, and the well tool 202A subsequently introduced into a wellbore 102 for utilization thereof for taking one or more formation fluid samples. Prior to coating the well tool 202A, analysis of the formation fluid and/or anticipated composition thereof can be utilized to determine what coating to deposit within well tool 202A. Subsequent utilization downhole in wellbore 102 (for example subsequent the taking of formation samples in sample chambers 90 as described hereinabove with reference to the well tool 202A of FIG. 7), formation sample analysis can again be utilized to determine whether or not the well tool 202A should be subjected to further coatings with well tool coating system 200A. For example, in applications where anticipated formation composition is utilized to determine an initial coating of the surface adjacent the interior volume 224 of well tool 202A, following utilization of well tool 202A downhole to obtain the one or more formation fluid samples in the one or more sample chambers 90, analysis of the formation samples retrieved from downhole by the well tool 202A can be utilized to determine if alternative and/or additional coating layers should be deposited within well tool 202A. For example, should anticipated formation composition not include significant mercury (Hg) and/or hydrogen sulfide ($H_2S$), and no initial coating be performed within well tool 202A, while analysis of sample(s) retrieved from the formation 104 indicates the presence of substantial $H_2S$ and/or Hg (or another component which can interfere with formation fluid analysis and/or corrode well tool 202A), a coating can be performed on-site to reduce the interaction of the interior surface 229 of interior volume 224 with the formation fluid during subsequent testing with well tool 202A (e.g., a coating that is resistant to $H_2S$ and/or Hg). Alternatively, if an initial coating selected for the well tool 202A were to prove ineffective to prevent and/or reduce interaction of the analyzed formation fluid obtained with well tool 202A, a new or additional coating of well tool 202A can be performed based on the analysis of the obtained formation fluid in sample chamber(s) 90 prior to further sampling therewith. If desired, etching of prior deposited coating(s) can be effected via ALE, as detailed hereinabove, prior to deposition of the new or additional coating layer(s).

Those of ordinary skill in the art will readily appreciate various benefits that may be realized by the present disclosure. The herein disclosed coating system 200/well tool coating system 200A enable on-site coating of interior surfaces 229 of a housing, apparatus, or tool 202/well tool 202A, at a jobsite, for example, at a wellsite 100 where a downhole tool 202A will be and/or has previously been utilized. This allows for the deposition of coatings within tools upon determination of a composition of a fluid to which the interior of the housing, apparatus, or tool 202/well tool 202A will subsequently be employed. The coatings can thus be tailored to meet the needs of a particular application at hand.

Because the herein disclosed surface coating system 200/well tool coating system 200A provides for spatial sequencing of gases, rather than solely temporal sequencing provided in conventional systems, a pump 214 may not be needed to evacuate the interior volume (e.g., the reaction zone 312) between coating layers (e.g., between steps (i) and (iii) of ALD forming described hereinabove. Accordingly, the herein disclosed surface coating system 200/well tool coating system 200A may provide for faster coating than conventional systems and/or coating under ambient conditions (e.g., without utilizing a pump 214 to draw a vacuum within interior volume 224 (or reaction zone(s) 312). In applications, a coating (e.g., an ALD coating) can be deposited at atmospheric pressure. In embodiments, spatially sequenced ALD pulses under ambient conditions (e.g., in the absence of a mechanical pump 214) can be utilized to deposit a coating on a housing, apparatus, or tool 202/well tool 202A. The deposition of the coating may be effected more rapidly than a conventional coating method comprising temporally spaced ALD pulsing.

In accordance with the present disclosure, it may be desirable to deposit a coating on a surface (e.g., within a well tool) to withstand a particular environment to which the surface will be exposed during operation, and thereby prolong a life of a housing, apparatus or tool comprising the surface. In contrast to traditional deposition systems that require a well tool to be disassembled into subcomponents of small enough size to fit inside an expensive commercial vacuum-chamber, which serves as a deposition chamber, housings, apparatus, and tools (e.g., well tools) need not be disassembled prior to coating with the methods, systems, and devices disclosed herein. Furthermore, in contrast to transporting a housing, apparatus, or tool to a commercial vacuum-chambers located at manufacturing facilities or laboratory facilities (which restricts when and how many times a surface coating process can be applied to the well tool), in accordance with the present disclosure housing, apparatus, and tools (e.g., well tools) can be coated proximate a jobsite (e.g., wellsite) and need not be transported, thereby saving the cost and time associated with transportation and promotes the application of multiple coatings (e.g., between jobs) as needed.

In some aspects, coatings can be deposited within a well tool using a well tool coating system according to one or more of the following examples.

Example #1: A surface coating unit of the present disclosure can include an elongated member coupled to a fluid delivery system and operable to supply a first reactant gas to a first zone within a well tool and a second reactant gas to a second zone within the well tool. The surface coating unit can also include a barrier positioned to physically isolate the first zone from the second zone and prevent intermixing of the first reactant gas with the second reactant gas. The surface coating unit is sized to fit within an inner diameter of the well tool for moving through an interior region of the well tool.

Example #2: The surface coating unit of Example #1 may feature the surface coating unit being translatable through an interior region of the well tool for applying an atomic layer deposition (ALD) process along an inner length of the well tool by simultaneously expelling the first reactant gas and the second reactant gas.

Example #3: The surface coating unit of any of Examples #1-2 may feature the barrier including flexible bristles sized to center the surface coating unit within the inner diameter of the well tool.

Example #4: The surface coating unit of any of Examples #1-3 may feature the well tool being positioned at a wellsite. The surface coating unit can be a mobile unit configured to perform a surface coating process inside the well tool while the well tool is positioned at the wellsite.

Example #5: The surface coating unit of any of Examples #1-4 may feature the elongated member being coupled to a vacuum pump for directing a flow of the first reactant gas or the second reactant gas out of a zone within the well tool as the surface coating unit is translated through the well tool to prevent intermixing of the first reactant gas and the second reactant gas.

Example #6: The surface coating unit of any of Examples #1-5 may feature the elongated member being coupled to a buffer gas source for supplying a buffer gas to a location between the first reactant gas and the second reactant gas. The buffer gas can serve as the barrier between the first reactant gas and the second reactant gas.

Example #7: The surface coating unit of any of Examples #1-6 may feature a heating unit for supplying thermal energy to an interior region of the well tool.

Example #8: The surface coating unit of any of Examples #1-7 may feature the surface coating unit being rotatable about a central axis for applying a surface coating process at various angles to an interior region of the well tool.

Example #9: A well tool coating system of the present disclosure can include an elongated member that is sized to move through an interior of a well tool. The system can include a first outlet coupled to the elongated member for supplying a first reactant gas from a first source to a first zone within the well tool. The system can include a second outlet coupled to the elongated member for supplying a second reactant gas from a second source to a second zone within the well tool. The system can include a third outlet positioned between the first outlet and the second outlet on the elongated member for expelling a buffer gas between the first reactant gas and the second reactant gas to prevent intermixing of the first reactant gas with the second reactant gas.

Example #10: The well tool coating system of Example #9 may feature the elongated member being translatable through the interior of the well tool for applying a surface coating process along an inner length of the well tool by simultaneously expelling the first reactant gas from the first outlet, the second reactant gas from the second outlet, and the buffer gas from the third outlet.

Example #11: The well tool coating system of any of Examples #9-10 may feature an inlet disposed between the first outlet and the second outlet on the elongated member. The inlet can be coupled to a vacuum pump for directing a flow of the first reactant gas or the second reactant gas out of a zone within the well tool as the elongated member is translated through the well tool to prevent intermixing of the first reactant gas and the second reactant gas.

Example #12: The well tool coating system of any of Examples #9-11 may feature a heating unit positioned on the elongated member for supplying thermal energy to the interior of the well tool.

Example #13: The well tool coating system of any of Examples #9-12 may feature the elongated member being rotatable about a central axis for applying a surface coating process at various angles to the interior of the well tool.

Example #14: The well tool coating system of any of Examples #9-13 may feature flexible bristles coupled to the elongated member for further preventing intermixing of the first reactant gas with the second reactant gas.

Example #15: A method of the present disclosure can include applying, by a surface coating unit, a surface coating process to an interior region of a well tool by expelling reactant gases into distinct zones inside the well tool while the surface coating unit is positioned inside the well tool. The method can include preventing the reactant gases from intermixing with one another by physically isolating the distinct zones from one another.

Example #16: The method of Example #15 may further include applying an atomic layer deposition (ALD) process along an inner length of the well tool by translating the surface coating unit through an interior region of the well tool while simultaneously expelling the reactant gases.

Example #17: The method of any of Examples #15-16 may further include physically isolating the distinct zones from one another includes positioning a physical barrier between the distinct zones.

Example #18: The method of any of Examples #15-17 may further include physically isolating the distinct zones from one another includes expelling a buffer gas between the distinct zones.

Example #19: The method of any of Examples #15-18 may further include suctioning at least one of the reactant gases from a zone within the well tool while translating the surface coating unit through the well tool using a vacuum pump.

Example #20: The method of any of Examples #15-18 may further include applying the surface coating process at various angles to an interior region of the well tool by rotating the surface coating unit about a central axis.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure. For instance, any example(s) described herein can be combined with any other example(s) to yield further examples.

ADDITIONAL DISCLOSURE PART I

The following are non-limiting, specific embodiments in accordance with the present disclosure:

Embodiment A: A surface coating unit comprising: an elongated member coupled to a fluid delivery system and operable to supply a first reactant gas to a first zone within a well tool and a second reactant gas to a second zone within the well tool; and a barrier positioned to physically isolate the first zone from the second zone and prevent intermixing of the first reactant gas with the second reactant gas, wherein the surface coating unit is sized to fit within an inner diameter of the well tool for moving through an interior region of the well tool.

Embodiment B: The surface coating unit of Embodiment A, wherein the surface coating unit is translatable through an interior region of the well tool for applying an atomic layer deposition (ALD) process along an inner length of the well tool by simultaneously expelling the first reactant gas and the second reactant gas.

Embodiment C: The surface coating unit of Embodiment A or Embodiment B, wherein the barrier includes flexible bristles sized to center the surface coating unit within the inner diameter of the well tool.

Embodiment D: The surface coating unit of any Embodiment A to Embodiment C, wherein the well tool is positioned at a wellsite, and wherein the surface coating unit is a mobile unit configured to perform a surface coating process inside the well tool while the well tool is positioned at the wellsite.

Embodiment E: The surface coating unit of Embodiment A to Embodiment D, wherein the elongated member is coupled to a vacuum pump for directing a flow of the first reactant gas or the second reactant gas out of a zone within the well tool as the surface coating unit is translated through the well tool to prevent intermixing of the first reactant gas and the second reactant gas.

Embodiment F: The surface coating unit of any of Embodiment A to Embodiment E, wherein the elongated member is coupled to a buffer gas source for supplying a buffer gas to a location between the first reactant gas and the second reactant gas, and wherein the buffer gas serves as the barrier between the first reactant gas and the second reactant gas.

Embodiment G: The surface coating unit of any of Embodiment A to Embodiment F, further comprising a heating unit for supplying thermal energy to an interior region of the well tool.

Embodiment H: The surface coating unit of any of Embodiment A to Embodiment G, wherein the surface coating unit is rotatable about a central axis for applying a surface coating process at various angles to the interior region of the well tool.

Embodiment I: A well tool coating system comprising: an elongated member that is sized to move through an interior of a well tool; a first outlet coupled to the elongated member for supplying a first reactant gas from a first source to a first zone within the well tool; a second outlet coupled to the elongated member for supplying a second reactant gas from a second source to a second zone within the well tool; and a third outlet positioned between the first outlet and the second outlet on the elongated member for expelling a buffer gas between the first reactant gas and the second reactant gas to prevent intermixing of the first reactant gas with the second reactant gas.

Embodiment J: The well tool coating system of Embodiment I, wherein the elongated member is translatable through the interior of the well tool for applying a surface coating process along an inner length of the well tool by simultaneously expelling the first reactant gas from the first outlet, the second reactant gas from the second outlet, and the buffer gas from the third outlet.

Embodiment K: The well tool coating system of Embodiment I or Embodiment J, further comprising an inlet disposed between the first outlet and the second outlet on the elongated member, the inlet being coupled to a vacuum pump for directing a flow of the first reactant gas or the second reactant gas out of a zone within the well tool as the elongated member is translated through the well tool to prevent intermixing of the first reactant gas and the second reactant gas.

Embodiment L: The well tool coating system of any of Embodiment I to Embodiment K, further comprising a heating unit positioned on the elongated member for supplying thermal energy to the interior of the well tool.

Embodiment M: The well tool coating system of any of Embodiment I to Embodiment L, wherein the elongated member is rotatable about a central axis for applying a surface coating process at various angles to the interior of the well tool.

Embodiment N: The well tool coating system of any of Embodiment I to Embodiment M, further comprising flexible bristles coupled to the elongated member for further preventing intermixing of the first reactant gas with the second reactant gas.

Embodiment O: A method comprising: applying, by a surface coating unit, a surface coating process to an interior region of a well tool by expelling reactant gases into distinct zones inside the well tool while the surface coating unit is positioned inside the well tool; and preventing, by the surface coating unit, the reactant gases from intermixing with one another by physically isolating the distinct zones from one another.

Embodiment P: The method of Embodiment O, further comprising applying an atomic layer deposition (ALD) process along an inner length of the well tool by translating the surface coating unit through an interior region of the well tool while simultaneously expelling the reactant gases.

Embodiment Q: The method of Embodiment O or Embodiment P, wherein physically isolating the distinct zones from one another includes positioning a physical barrier between the distinct zones.

Embodiment R: The method of any of Embodiment O to Embodiment Q, wherein physically isolating the distinct zones from one another includes expelling a buffer gas between the distinct zones.

Embodiment S: The method of any of Embodiment O to Embodiment R, further comprising suctioning at least one of the reactant gases from a zone in the well tool while translating the surface coating unit through the well tool using a vacuum pump.

Embodiment T: The method of any of Embodiment O to Embodiment S, further comprising applying the surface coating process at various angles to an interior region of the well tool by rotating the surface coating unit about a central axis.

Embodiment U: A device for coating a interior surface adjacent an interior volume disposed within a housing, wherein the interior volume has an inlet extending through the housing such that the interior volume is accessible from an exterior of the housing via the inlet, the device comprising: an elongated member having a first end and a second end and at least one fluid flow path extending from the first end to the second end, the elongated member fluidically coupled to at least one delivery line proximate the first end and configured for placement in the interior volume via the inlet; a plurality of reactant gas sources including reactant gases for one or more surface coating processes and fluidically coupled to the at least one delivery line; optionally, a plasma generator configured to generate a plasma and fluidically coupled to the at least one delivery line; a first barrier disposed about the elongated member and configured to divide the interior volume into a first zone and a second zone, the first barrier further dividing the elongated member into a first portion corresponding with the first zone and a second portion corresponding with the second zone; a first port disposed within the first portion of the elongated member and in fluid communication with the at least one fluid flow path of the elongated member, the first port configured to introduce one or more of the reactant gases, the plasma, or both to the first zone such that upon reaction of the one or more reactant gases, optionally in the presence of the plasma, a coating is formed on all or a portion of the surface adjacent the interior volume of the housing within the first zone; and a second port disposed within the second portion of the elongated member and in fluid communication with the at least one fluid flow path of the elongated member, the second port configured to introduce one or more of the reactant gases, the plasma, or both to the second zone such that upon reaction of the one or more reactant gases, optionally in the presence of the plasma, a coating is formed on all or a portion of the surface adjacent the interior volume of the housing within the second zone.

Embodiment V: The device of Embodiment U further comprising a pump fluidically coupled to a first end of a vacuum line, and a second end of the vacuum line fluidically coupled to the elongated member proximate the first or second end of the elongated member, the pump configured to create a vacuum in the vacuum line, said vacuum effective to evacuate a residual gas from the first zone, the second zone, the at least one fluid flow path of the elongated member, or combinations thereof.

Embodiment W: The device of Embodiment U or Embodiment V further comprising: a second barrier surrounding the elongated member, the second barrier spaced a distance from the first barrier in a direction of the first end of the elongated member and configured to enclose the first zone between the first and second barriers; and a third barrier surrounding the elongated member, the third barrier spaced a distance from the first barrier in a direction of the second end of the elongated member and configured to enclose the second zone between the first and third barriers.

Embodiment X: The device of Embodiment V or Embodiment W, wherein the housing has an outlet extending through the housing such that the interior volume is accessible from an exterior of the housing via the inlet and the outlet, wherein the delivery line is configured to pass through the inlet when fluidically coupled to the elongated member, and wherein the vacuum line is configured to pass through the outlet when fluidically coupled to the elongated member.

Embodiment Y: The device of any of Embodiment U to Embodiment X, further comprising an actuator configured to translate and/or rotate the elongated member relative to the housing and/or the housing relative to the elongated member.

Embodiment Z1: The device of any of Embodiment U to Embodiment Y, wherein the elongated member is flexible or rigid.

Embodiment Z2: The device of any of Embodiment U to Embodiment Z1, wherein the interior volume and/or the elongated member has an aspect ratio that is less than or equal to about 0.5, 0.05, or 0.005, wherein the aspect ratio is an average width of the interior volume and/or the elongated member, respectively, divided by an average length thereof.

Embodiment Z3: The device of any of Embodiment U to Embodiment Z2, comprising a dedicated delivery line and associated fluid flow path for each of the first zone and the second zone.

Embodiment Z4: The device of any of Embodiment U to Embodiment Z3, wherein the first barrier is radially disposed about the elongated member, such that the first zone and the second zone are axially spaced along the elongated member, wherein the first barrier is axially disposed along a length of the elongated member, such that the first zone and the second zone are radially spaced about the elongated member, or both.

Embodiment Z5: The device of any of Embodiment U to Embodiment Z4, wherein the first barrier, the second barrier, and/or the third barrier is a physical barrier or a fluidic barrier.

Embodiment Z6: The device of Embodiment Z5, wherein the first barrier, the second barrier, and/or the third barrier is a physical barrier comprising an elastomer seal, bristles, an inflatable seal, a wiper plug structure, or a combination thereof.

Embodiment Z7: The device of Embodiment Z5, wherein the first barrier, the second barrier, and/or the third barrier is a fluidic barrier comprising a barrier of purge gas, a ferro fluid, or a combination thereof.

Embodiment Z8: The device of any of Embodiment U to Embodiment Z7, wherein the first barrier, the second barrier, and/or the third barrier is configured to centralize the elongated member within the interior volume.

Embodiment Z9: The device of any of Embodiment U to Embodiment Z8, wherein the one or more surface coating processes comprise chemical vapor deposition (CVD), atomic layer deposition (ALD), or both.

Embodiment Z10: The device of any of Embodiment U to Embodiment Z9, wherein the coating formed on all or the portion of the surface adjacent the interior volume of the housing within the second zone is different from the coating formed on all or the portion of the surface adjacent the interior volume of the housing within the first zone.

Embodiment Z11: The device of any of Embodiment U to Embodiment Z10, wherein the coating formed on all or the portion of the surface adjacent the interior volume of the housing within the second zone has a different thickness and/or composition from a thickness and/or composition of the coating formed on all or the portion of the surface adjacent the interior volume of the housing within the first zone.

Embodiment Z12: The device of any of Embodiment V to Embodiment Z12, wherein the residual gas comprises unreacted reactant gases, buffer gas, or both.

Embodiment Z13: The device of any of Embodiment U to Embodiment Z12 further comprising an ion generator configured for applying an atomic layer etching (ALE) process to all or a portion of the surface adjacent the interior volume of the housing within the first zone, all or a portion of the surface adjacent the interior volume of the housing within the second zone, or both.

Embodiment Z14: The device of any of Embodiment U to Embodiment Z13 further comprising a heating unit in thermal communication with the housing.

Embodiment Z15: The device of any of Embodiment U to Embodiment Z14 further comprising a controller in electronic communication with the heating unit to control heating of the housing, in electronic communication with the plurality of reactant gas sources to control delivery of reactant gases to the interior volume via the delivery line, in electronic communication with the plasma generator to control delivery of plasma to the interior volume via the delivery line, or combinations thereof.

Embodiment Z16: The device of any of Embodiment V to Embodiment Z15 further comprising a trap upstream of the pump and downstream of the housing, wherein the trap is operable as a filter and/or a second or auxiliary coating chamber.

Embodiment Z17: The device of any of Embodiment U to Embodiment Z16, wherein the housing comprises a furnace tube, an aircraft component, a component of a water supply/treatment system; a component of a vehicle fuel system; a well tool; a heat exchanger or component thereof; a pump or component thereof; a reactor or component thereof; a distillation column or component thereof; a condenser or component thereof; a reboiler or component thereof; an interior volume of a storage vessel; an interior volume of a transportation vessel; or another housing.

Embodiment Z18: device of any of Embodiment U to Embodiment Z17, wherein the coating device is portable, and further comprises a portable conveyance configured to transport the device to a worksite.

Embodiment Z19: The device of any of Embodiment U to Embodiment Z18, wherein the housing comprises production tubing, a pipeline, or a well tool.

Embodiment Z20: A method of coating an interior surface adjacent an interior volume of a housing, wherein the interior volume has an inlet, the method comprising: partitioning the interior volume of the housing into a first zone and a second zone, the first zone isolated from fluid communication with the second zone; introducing one or more reactant gases, plasma, or both to the first zone and the second zone; forming one or more coating layers on all or a portion of the surface adjacent the interior volume of the housing within the first zone and the surface adjacent the interior volume of the housing within the second zone via reaction of the reactant gases, optionally in the presence of the plasma; and optionally, evacuating an unreacted portion of the one or more reactant gases from the first zone, the second zone, or both.

Embodiment Z21: A method of coating an interior surface adjacent an interior volume of a housing, wherein the interior volume has an inlet, the method comprising: positioning the coating device of Embodiment V and the housing proximate each other; placing the elongated member into the interior volume of the housing via the inlet, whereby the first barrier divides the interior volume into the first zone and the second zone; introducing one or more reactant gases, plasma, or both to the first zone and the second zone via the at least one delivery line, the at least one fluid flow path, and the first port and the second port, respectively; forming one or more coating layers on all or a portion of the surface adjacent the interior volume of the housing within the first zone and the second zone via reaction of the one or more reactant gases, optionally in the presence of the plasma; and optionally, activating the pump to evacuate an unreacted portion of the one or more reactant gases from the first zone, the second zone, or both.

Embodiment Z22: The method of Embodiment Z20 or Embodiment Z21, wherein the reaction comprises a chemical vapor deposition (CVD) reaction, an atomic layer deposition (ALD) reaction, or both, such that the one or more coating layers respectively comprise an ALD layer, a CVD layer, or both.

Embodiment Z23: The method of Embodiment Z22 further comprising: (i) forming the ALD layer by: introducing a first reactant gas into a reaction zone selected from the first zone and the second zone, such that at least a portion of the first reactant gas chemically bonds with the surface adjacent the interior volume within the reaction zone, to form a reactive layer; removing unreacted first reactant gas and/or gaseous byproducts from the reaction zone; introducing a second reactant gas into the reaction zone, such that at least some of the second reactant gas bonds with the reactive layer to form the ALD layer; and optionally removing unreacted second reactant gas and/or gaseous byproducts from the reaction zone; (ii) forming the CVD layer by: introducing at least a third reactant gas into the a reaction zone selected from the first zone and the second zone, such that the at least the third reactant gas chemically reacts with the surface adjacent the interior volume of the housing within the reaction zone to form the CVD layer; or (iii) both forming an ALD layer via (i) and a CVD layer via (ii), wherein forming both an ALD layer and a CVD layer comprises forming an ALD layer on the surface adjacent the interior volume of the housing within the reaction zone and subsequently forming the CVD layer on the ALD layer or forming the CVD layer on the surface adjacent the interior volume of the housing within the reaction zone and subsequently forming the ALD layer on the CVD layer.

Embodiment Z24: The method of Embodiment Z23 further comprising performing an atomic layer etching (ALE) process to pre-treat the surface adjacent the interior volume of the housing within the reaction zone prior to the forming of the one or more coating layers on the all or the portion of the surface adjacent the interior volume of the housing within the reaction zone and/or to reduce a thickness of at least one of the one or more coating layers.

Embodiment Z25: The method of Embodiment Z24, wherein the ALE process comprises: applying an etching gas to the surface in the interior volume of the housing within the reaction zone, such that the surface chemically reacts with and adsorbs the etching gas; purging the etching gas and any gaseous byproducts from the reaction zone; applying low-energy ions to the portions of the surface that chemically reacted with the etching gas to etch away said portions; and optionally purging byproducts.

Embodiment Z26: The method of any of Embodiment Z23 to Embodiment Z25 further comprising flowing a topical reagent to at least one of the one or more coating layers, the topical reagent configured to react with the coating layer and thereby adjust a material characteristic of the coating layer.

Embodiment Z27: The method of Embodiment Z26, wherein the flowing of the topical reagent to at least one of the one or more coating layers includes flowing the topical reagent to a topmost coating layer on the all or the portion of the surface adjacent the interior volume of the housing within the first zone and/or a topmost coating layer on the all or the portion of the surface adjacent the interior volume of the housing within the second zone, wherein the topmost coating layer is a one of the one or more coating layers farthest from the surface adjacent the interior volume of the housing.

Embodiment Z28: The method of any of Embodiment Z20 or Z21 further comprising: introducing a first reactant gas and/or plasma into the first zone and a second reactant gas and/or plasma into the second zone, the first reactant gas and/or plasma and the second reactant gas and/or plasma being the same or different; translating and/or rotating the elongated member and/or the housing; and introducing a third reactant gas and/or plasma into the first reaction zone and/or a fourth reactant gas and/or plasma into the second zone to form an initial coating layer on the surface adjacent the interior volume within the first zone and an initial coating on the surface adjacent the interior volume within the second zone, the initial coating layer on the surface adjacent the interior volume of the housing within the first zone being the same or different from the initial coating on the surface adjacent the interior volume of the housing within the second zone; and/or subsequent forming the one or more coating layers on the all or the portion of the surface adjacent the first zone and the second zone, translating and/or rotating the elongated member within the interior volume and/or translating and/or rotating the housing about the elongated member to provide a third zone and optionally a fourth zone, introducing one or more reactant gases, plasma, or both to the third zone and/or the fourth zone, and forming one or more coating layers on all or a portion of the surface adjacent the interior volume of the housing within the third zone and/or the surface adjacent the interior volume of the housing within the fourth zone via reaction of the reactant gases, optionally in the presence of the plasma.

Embodiment Z29: The method of any of Embodiment Z20 to Embodiment Z28, wherein the housing comprises a furnace tube, an aircraft component, a component of a water supply/treatment system; a component of a vehicle fuel system; a well tool; a heat exchanger or component thereof; a pump or component thereof; a reactor or component thereof; a distillation column or component thereof; a condenser or component thereof; a reboiler or component thereof; an interior volume of a storage vessel; an interior volume of a transportation vessel; or another housing.

Embodiment Z30: The method of any of Embodiment Z20 to Embodiment Z29, wherein the interior volume includes a fluid flow path within the housing.

Embodiment Z31: The method of any of Embodiment Z20 to Embodiment Z30 further comprising forming the one or more coating layers at a worksite at which the housing will subsequently be employed.

Embodiment Z32: The method of any of Embodiment Z20 to Embodiment Z31, wherein the housing comprises the well tool, wherein the well tool is a logging while drilling (LWD) tool, a measurements while drilling (MWD) tool, or a sampling while drilling (SWD) tool, and wherein the interior volume of the well tool comprises a fluid flow path configured for flow of a formation fluid from an exterior of the well tool through an interior of the well tool.

Embodiment Z33: The method of Embodiment Z32 further comprising placing the well tool in a wellbore and contacting the formation fluid with the coated surface.

Embodiment Z34: The method of Embodiment Z33, wherein the well tool is a formation sampling tool, and wherein contacting the formation fluid with the coated surface further comprises taking a formation fluid sample with the well tool.

Embodiment Z35: The method of Embodiment Z34 further comprising retrieving the formation fluid sample from the wellbore, performing a composition analysis of the formation fluid sample, and determining whether or not to recoat the well tool based on the analysis.

ADDITIONAL DISCLOSURE PART II

The following are non-limiting, specific embodiments in accordance with the present disclosure:

A first embodiment, which is a device for coating an interior surface of a housing defining a volume, the device comprising a plurality of reactant gas sources including reactant gases for one or more surface coating processes, a fluid flow conduit fluidically coupled to the plurality of reactant gas sources and extending from the plurality of gas sources to the volume, a first barrier disposed about the fluid flow conduit and dividing the fluid flow conduit into a first portion and a second portion within the volume, and first and second fluid flow ports disposed within the first and second portions, respectively, of the fluid flow conduit, wherein the one or more of the reactant gases are flowable to the interior surface proximate the first and second fluid flow ports.

A second embodiment, which is the device of the first embodiment further comprising a second barrier disposed about the fluid flow conduit and spaced a distance from the first barrier to form a first zone between the first and second barriers, and a third barrier disposed about the fluid flow conduit and spaced a distance from the first barrier to form a second zone between the first and third barriers.

A third embodiment, which is the device of the first embodiment further comprising an actuator, wherein the actuator is coupled to the fluid conduit, the housing or both to translate and/or rotate the fluid conduit relative to the housing, the housing relative to the fluid conduit, or both.

A fourth embodiment, which is the device of any of the first through the third embodiments, wherein the volume has an aspect ratio that is less than or equal to about 0.5, the aspect ratio being an average width of the volume divided by an average length thereof.

A fifth embodiment, which is the device of the second embodiment, wherein the first barrier is radially disposed about the fluid flow conduit such that the first zone and the second zone are axially spaced along fluid flow conduit, wherein the first barrier is axially disposed along a length of the fluid flow conduit such that the first zone and the second zone are radially spaced about the fluid flow conduit, or both.

A sixth embodiment, which is the device of the second embodiment, wherein the first barrier, the second barrier, and/or the third barrier centralize the fluid flow conduit within the interior volume.

A seventh embodiment, which is the device of any of the first through the sixth embodiments, wherein the one or more surface coating processes comprise chemical vapor deposition (CVD), atomic layer deposition (ALD), or both.

An eighth embodiment, which is the device of the second embodiment further comprising a plasma source fluidically coupled to the fluid flow conduit to provide plasma for the one or more surface coating processes, an ion source fluidically coupled to the fluid flow conduit to provide ions for the one or more surface coating processes, a heating unit in thermal communication with the housing to heat the housing for the one or more surface coating processes, and/or a controller in electronic communication with the plurality of reactant gas sources, the plasma source, the ion source, and/or the heating unit to control the plurality of reactant gas sources, the plasma source, the ion source, and/or the heating unit during the one or more surface coating processes.

A ninth embodiment, which is the device of any of the first through the eighth embodiments, wherein the housing comprises production tubing, a pipeline, or a well tool.

A tenth embodiment, which is a method of coating an interior surface of a housing defining a volume, the method comprising positioning the coating device of the eighth embodiment and the housing proximate each other, placing the fluid flow conduit into the volume via an inlet in the housing, whereby the first barrier divides the volume into the first zone and the second zone, introducing one or more reactant gases, a plasma, ions, or a combination thereof to the first zone and the second zone via the fluid flow conduit, and forming one or more coating layers on all or a portion of the interior surface within the first zone and the second zone via reaction of the one or more reactant gases, the plasma, ions, or the combination thereof.

An eleventh embodiment, which is a method of coating an interior surface of a housing defining a volume, the method comprising partitioning the volume into a first zone and a second zone, the first zone isolated from fluid communication with the second zone, introducing one or more reactant gases, plasma, ions, or a combination thereof to the first zone and the second zone, and forming one or more coating layers on all or a portion of the interior surface within the first and second zones via reaction of the reactant gases, the plasma, or the combination thereof.

A twelfth embodiment, which is the method of the eleventh embodiment, wherein the reaction comprises a chemical vapor deposition (CVD) reaction, an atomic layer deposition (ALD) reaction, or both, such that the one or more coating layers respectively comprise an ALD layer, a CVD layer, or both.

A thirteenth embodiment, which is the method of the twelfth embodiment further comprising (i) forming the ALD layer by introducing a first reactant gas into a reaction zone selected from the first zone and the second zone, such that at least a portion of the first reactant gas chemically bonds with the interior surface within the reaction zone to form a reactive layer; removing unreacted first reactant gas and/or gaseous byproducts from the reaction zone; and introducing a second reactant gas into the reaction zone, such that at least some of the second reactant gas bonds with the reactive layer to form the ALD layer, (ii) forming the CVD layer by introducing at least a third reactant gas into the a reaction zone selected from the first zone and the second zone, such that the at least the third reactant gas chemically reacts with the interior surface within the reaction zone to form the CVD layer, or (iii) both forming an ALD layer via (i) and a CVD layer via (ii), wherein forming both an ALD layer and a CVD layer comprises forming an ALD layer on the interior surface within the reaction zone and subsequently forming the CVD layer on the ALD layer or forming the CVD layer on the interior surface within the reaction zone and subsequently forming the ALD layer on the CVD layer.

A fourteenth embodiment, which is the method of the thirteenth embodiment further comprising performing an atomic layer etching (ALE) process to pre-treat the interior surface within the reaction zone prior to the forming of the one or more coating layers and/or to reduce a thickness of at least one of the one or more coating layers.

A fifteenth embodiment, which is the method of the thirteenth embodiment further comprising flowing a topical reagent to at least one of the one or more coating layers, wherein the topical reagent reacts with the coating layer to adjust a material characteristic of the coating layer.

A sixteenth embodiment, which is the method of the eleventh embodiment further comprising introducing a first reactant gas and/or plasma into the first zone and a second reactant gas and/or plasma into the second zone; translating and/or rotating a fluid flow conduit within the volume and/or translating and/or rotating the housing about the fluid flow conduit; and introducing a third reactant gas and/or plasma into the first reaction zone and/or a fourth reactant gas and/or plasma into the second zone to form a coating layer on the interior surface within the first and second zones, and/or subsequent to forming a coating layer, translating and/or rotating the fluid flow conduit within the volume and/or translating and/or rotating the housing about the fluid flow conduit to provide a third zone and/or a fourth zone; introducing one or more reactant gases, plasma, or a combination thereof to the third zone and/or the fourth zone; and forming one or more coating layers on all or a portion of the interior surface within the third and/or fourth zone via reaction of the reactant gases, the plasma, or the combination thereof.

A seventeenth embodiment, which is the method of any of the eleventh through the sixteenth embodiments, wherein the volume defines a fluid flow path through the housing.

An eighteenth embodiment, which is the method of any of the eleventh through the seventeenth embodiments, wherein the housing comprises the well tool, wherein the well tool is a logging while drilling (LWD) tool, a measurements while drilling (MWD) tool, or a sampling while drilling (SWD) tool, and wherein the volume of the well tool define a fluid flow path for flow of a formation fluid from an exterior of the well tool through an interior of the well tool.

A nineteenth embodiment, which is the method of the eighteenth embodiment further comprising placing the well tool in a wellbore and contacting the formation fluid with the coated surface.

A twentieth embodiment, which is the method of the nineteenth embodiment, wherein the well tool is a formation sampling tool, and wherein contacting the formation fluid with the coated surface further comprises taking a formation fluid sample with the well tool.

A twenty-first embodiment, which is a system comprising the device of any of the first to the ninth embodiments and a housing (e.g., well tool) defining a volume, wherein the device is coupled to the housing to perform the one or more surface coating processes.

A twenty-second embodiment, which is the method of any of the tenth to the twentieth embodiments carried out with the system of the twenty-first embodiment.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: $R=Rl+k*(Ru-Rl)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the embodiments of the present disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

What is claimed is:

1. A method of coating an interior surface adjacent an interior volume of a housing, wherein the interior volume has an inlet, the method comprising: partitioning the interior volume of the housing into a first zone and a second zone by introducing an elongated member into the interior volume, the elongated member having a substantially cylindrical surface defining an interior consisting of one or more fluid flow paths, isolating the first zone from fluid communication with the second zone by positioning a physical barrier therebetween or expelling a buffer gas therebetween, wherein the physical barrier, when present, comprises an elastomer seal, bristles, an inflatable seal, a packer, a wiper plug structure, or a combination thereof; introducing one or more reactant gases, plasma, or both to the first zone and the second zone via the one or more fluid flow paths and one or more outlet ports on the substantially cylindrical surface of the elongated member; forming one or more coating layers on all or a portion of the surface adjacent the interior volume of the housing within the first zone and the surface adjacent the interior volume of the housing within the second zone via reaction of the reactant gases, optionally in the presence of the plasma; and, optionally, evacuating an unreacted portion of the one or more reactant gases from the first zone, the second zone, or both.

2. The method of claim 1, wherein the reaction comprises a chemical vapor deposition (CVD) reaction, an atomic layer deposition (ALD) reaction, or both, such that the one or more coating layers respectively comprise an ALD layer, a CVD layer, or both.

3. The method of claim 2, further comprising: (i) forming the ALD layer by: introducing a first reactant gas into a reaction zone selected from the first zone and the second zone, such that at least a portion of the first reactant gas chemically bonds with the surface adjacent the interior volume within the reaction zone, to form a reactive layer; removing unreacted first reactant gas and/or gaseous byproducts from the reaction zone; introducing a second reactant gas into the reaction zone, such that at least some of the second reactant gas bonds with the reactive layer to form the ALD layer; and optionally removing unreacted second reactant gas and/or gaseous byproducts from the reaction zone; (ii) forming the CVD layer by: introducing at least a third reactant gas into the a reaction zone selected from the first zone and the second zone, such that the at least the third reactant gas chemically reacts with the surface adjacent the interior volume of the housing within the reaction zone to form the CVD layer; or (iii) both forming an ALD layer via (i) and a CVD layer via (ii), wherein forming both an ALD layer and a CVD layer comprises forming an ALD layer on the surface adjacent the interior volume of the housing within the reaction zone and subsequently forming the CVD layer on the ALD layer or forming the CVD layer on the surface adjacent the interior volume of the housing within the reaction zone and subsequently forming the ALD layer on the CVD layer.

4. The method of claim 3, further comprising performing an atomic layer etching (ALE) process to pre-treat the surface adjacent the interior volume of the housing within the reaction zone prior to the forming of the one or more coating layers on the all or the portion of the surface adjacent the interior volume of the housing within the reaction zone and/or to reduce a thickness of at least one of the one or more coating layers.

5. The method of claim 4, wherein the ALE process comprises: applying an etching gas to the surface in the interior volume of the housing within the reaction zone, such that the surface chemically reacts with and adsorbs the etching gas; purging the etching gas and any gaseous byproducts from the reaction zone; applying low-energy ions to the portions of the surface that chemically reacted with the etching gas to etch away said portions; and optionally purging byproducts.

6. The method of claim 3, further comprising flowing a topical reagent to at least one of the one or more coating layers, the topical reagent configured to react with the coating layer and thereby adjust a material characteristic of the coating layer.

7. The method of claim 6, wherein the flowing of the topical reagent to at least one of the one or more coating layers includes flowing the topical reagent to a topmost coating layer on the all or the portion of the surface adjacent the interior volume of the housing within the first zone and/or a topmost coating layer on the all or the portion of the surface adjacent the interior volume of the housing within the second zone, wherein the topmost coating layer is a one of the one or more coating layers farthest from the surface adjacent the interior volume of the housing.

8. The method of claim 1, further comprising: introducing a first reactant gas and/or plasma into the first zone and a second reactant gas and/or plasma into the second zone, the first reactant gas and/or plasma and the second reactant gas and/or plasma being the same or different; translating and/or rotating the elongated member and/or the housing; and introducing a third reactant gas and/or plasma into the first reaction zone and/or a fourth reactant gas and/or plasma into the second zone to form an initial coating layer on the surface adjacent the interior volume within the first zone and an initial coating on the surface adjacent the interior volume within the second zone, the initial coating layer on the surface adjacent the interior volume of the housing within the first zone being the same or different from the initial coating on the surface adjacent the interior volume of the housing within the second zone; and/or subsequent forming the one or more coating layers on the all or the portion of the surface adjacent the first zone and the second zone, translating and/or rotating the elongated member within the interior volume and/or translating and/or rotating the housing about the elongated member to provide a third zone and optionally a fourth zone, introducing one or more reactant gases, plasma, or both to the third zone and/or the fourth zone, and forming one or more coating layers on all or a portion of the surface adjacent the interior volume of the housing within the third zone and/or the surface adjacent the interior volume of the housing within the fourth zone via reaction of the reactant gases, optionally in the presence of the plasma.

9. The method of claim 1, wherein the housing comprises a furnace tube, an aircraft component, a component of a water supply/treatment system; a component of a vehicle fuel system; a well tool; a heat exchanger or component thereof; a pump or component thereof; a reactor or component thereof, a distillation column or component thereof, a condenser or component thereof; a reboiler or component thereof; an interior volume of a storage vessel; an interior volume of a transportation vessel; or another housing.

10. The method of claim 1, wherein the interior volume includes a fluid flow path within the housing.

11. The method of claim 1, further comprising forming the one or more coating layers at a worksite at which the housing will subsequently be employed.

12. The method of any of claim 1, wherein the housing comprises the well tool, wherein the well tool is a logging while drilling (LWD) tool, a measurements while drilling (MWD) tool, or a sampling while drilling (SWD) tool, and wherein the interior volume of the well tool comprises a fluid flow path configured for flow of a formation fluid from an exterior of the well tool through an interior of the well tool.

13. The method of claim 12, further comprising placing the well tool in a wellbore and contacting the formation fluid with the coated surface.

14. The method of claim 13, wherein the well tool is a formation sampling tool, and wherein contacting the formation fluid with the coated surface further comprises taking a formation fluid sample with the well tool.

15. The method of claim 14, further comprising retrieving the formation fluid sample from the wellbore, performing a composition analysis of the formation fluid sample, and recoating or not recoating the well tool based on the analysis.

16. A method of coating an interior surface adjacent an interior volume of a housing, wherein the interior volume has an inlet, the method comprising:
positioning a coating device of and the housing proximate each other,
wherein coating device comprises an elongated member coupled to a fluid delivery system and operable to supply a first reactant gas to a first zone within the interior volume and a second reactant gas to a second zone within the interior volume, wherein the elongated member has a substantially cylindrical surface defining an interior consisting of one or more fluid flow paths; and a barrier positioned to physically isolate the first zone from the second zone and prevent intermixing of the first reactant gas with the second reactant gas, wherein the barrier comprises an elastomer seal, bristles, an inflatable seal, a packer, a wiper plug structure, or a combination thereof, and wherein the surface coating unit is sized to fit within an inner diameter of the interior volume for moving through the interior volume;

placing the elongated member into the interior volume of the housing via the inlet, whereby the first barrier divides the interior volume into the first zone and the second zone;

introducing one or more reactant gases, plasma, or both to the first zone and the second zone via the one or more fluid flow paths and one or more outlet ports on the substantially cylindrical surface of the elongated member;

forming one or more coating layers on all or a portion of the surface adjacent the interior volume of the housing within the first zone and the second zone via reaction of the one or more reactant gases, optionally in the presence of the plasma; and optionally, activating a pump to evacuate an unreacted portion of the one or more reactant gases from the first zone, the second zone, or both.

17. A method comprising: applying, by a surface coating unit, a surface coating process to an interior region of a well tool by expelling reactant gases into fluidically distinct zones inside the well tool while the surface coating unit is positioned inside the well tool; and preventing, by the surface coating unit, the reactant gases from intermixing with one another by physically isolating the distinct zones from one another by positioning a physical barrier between the distinct zones or expelling a buffer gas between the distinct zones, wherein the physical barrier, when present, comprises an elastomer seal, bristles, an inflatable seal, a packer, a wiper plug structure, or a combination thereof, wherein the surface coating unit comprises an elongated member, wherein the elongated member has a substantially cylindrical surface defining an interior consisting of one or more fluid flow paths, and wherein the reactant gases are expelled into the fluidically distinct zones via the one or more fluid flow paths and one or more outlet ports on the substantially cylindrical surface of the elongated member.

18. The method of claim 17, further comprising applying an atomic layer deposition (ALD) process along an inner length of the well tool by translating the surface coating unit through an interior region of the well tool while simultaneously expelling the reactant gases.

19. The method of claim 17, wherein physically isolating the distinct zones from one another includes positioning a physical barrier between the distinct zones or expelling a buffer gas between the distinct zones.

20. The method of claim 17, further comprising suctioning at least one of the reactant gases from a zone in the well tool while translating the surface coating unit through the well tool using a vacuum pump or applying the surface coating process at various angles to an interior region of the well tool by rotating the surface coating unit about a central axis.

21. The method of claim 1, further comprising isolating the first zone from fluid communication with the second zone by expelling the buffer gas between the first zone and the second zone.

22. The method of claim 21, comprising isolating the first zone from fluid communication with the second zone by positioning the physical barrier between the first zone and the second zone, wherein the physical barrier comprises the elastomer seal, the bristles, the inflatable seal, the packer, the wiper plug structure, or the combination thereof.

23. The method of claim 1 comprising introducing the one or more reactant gases to the first zone and the second zone; and forming one or more coating layers on the all or the portion of the surface adjacent the interior volume of the housing within the first zone and the surface adjacent the interior volume of the housing within the second zone via reaction of the reactant gases.

* * * * *